US012512580B2

(12) United States Patent
Wang et al.

(10) Patent No.: US 12,512,580 B2
(45) Date of Patent: Dec. 30, 2025

(54) ULTRA-WIDEBAND OMNIDIRECTIONAL AND POLARIZATION INSENSITIVE DUO ALOE VERA CRUCES CONCENTRICIS ANTENNA STRUCTURE APPLIED TO ELECTROMAGNETIC WAVE ENERGY ABSORBER, THERMOELECTRIC ENERGY HARVESTER, PHOTOCONDUCTIVE ANTENNA, ARRAY ANTENNA AND RECTENNA

(71) Applicant: National Tsing Hua University, Hsinchu (TW)

(72) Inventors: Wei-Chih Wang, Sammamish, WA (US); Prabir Garu, Hsinchu (TW); Fiona Marie Wang, Seattle, WA (US)

(73) Assignee: National Tsing Hua University, Hsinchu (TW)

( * ) Notice: Subject to any disclaimer, the term of this patent is extended or adjusted under 35 U.S.C. 154(b) by 819 days.

(21) Appl. No.: 17/836,140

(22) Filed: Jun. 9, 2022

(65) Prior Publication Data

US 2023/0402740 A1 Dec. 14, 2023

(51) Int. Cl.
*H01Q 1/24* (2006.01)
*H01Q 19/13* (2006.01)
(Continued)

(52) U.S. Cl.
CPC ........... *H01Q 1/248* (2013.01); *H01Q 19/136* (2013.01); *H01Q 21/22* (2013.01); *H10N 10/82* (2023.02)

(58) Field of Classification Search
CPC ...... H01Q 1/248; H01Q 21/22; H01Q 19/136; H10N 10/82
See application file for complete search history.

(56) References Cited

U.S. PATENT DOCUMENTS 7,057,564 B2 * 6/2006 Tsai ........................ H01L 23/66 343/770
2012/0274537 A1 * 11/2012 Kitchener ................ H01Q 1/48 343/860
(Continued)

OTHER PUBLICATIONS

Wei-Chih, Design of an ultra-wideband omnidirectional and polarization insensitive flower petal antenna for potential ambient electromagnetic energy harvesting applications, Apr. 12, 2022, Nature Research, Scientific Reports, vol. 12, pp. 1-16.*
(Continued)

*Primary Examiner* — Hai V Tran
(74) *Attorney, Agent, or Firm* — Servilla Whitney LLC

(57) ABSTRACT

A Duo Aloe Vera Cruces Concentricis antenna structure is provided and includes a first conductive layer, a dielectric layer and a second conductive layer. The first metal units of the first conductive layer form a first tapered hole. The second metal units of the first conductive layer are located in the first tapered hole and form a second tapered hole. The third units and the fourth units of the dielectric layer are aligned with the first metal units and the second metal units, respectively. The second conductive layer is connected to the dielectric layer. The first tapered hole has at least one first center line. The second tapered hole has at least one second center line. An included angle between the at least one first center line and the at least one second center line is 45 degrees.

23 Claims, 21 Drawing Sheets

(51) Int. Cl.

| | |
|---|---|
| ***H01Q 21/22*** | (2006.01) |
| ***H10N 10/82*** | (2023.01) |

(56) References Cited

U.S. PATENT DOCUMENTS

| | | | | |
|---|---|---|---|---|
| 2017/0256696 | A1 | 9/2017 | Colinge et al. | |
| 2018/0146554 | A1* | 5/2018 | Kajihara | H05K 1/115 |
| 2019/0058242 | A1* | 2/2019 | Tabe | H01Q 1/248 |
| 2023/0268654 | A1* | 8/2023 | Wang | H01Q 9/0485 257/499 |
| 2024/0304982 | A1* | 9/2024 | Wu | H01Q 13/18 |

OTHER PUBLICATIONS

PCT International Search Report and Written Opinion in PCT/US22/32772 dated Aug. 25, 2022, 12 pages.

Wang, Wei-Chih , et al., "Design of an ultra-wideband omnidirectional and polarization insensitive flower petal antenna for potential ambient electromagnetic energy harvesting applications", Scientific Reports, published on Apr. 12, 2022, vol. 12, article No. 6096, pp. 1-16, published by Nature Research, United Kingdom.

* cited by examiner

ULTRA-WIDEBAND OMNIDIRECTIONAL AND POLARIZATION INSENSITIVE DUO ALOE VERA CRUCES CONCENTRICIS ANTENNA STRUCTURE APPLIED TO ELECTROMAGNETIC WAVE ENERGY ABSORBER, THERMOELECTRIC ENERGY HARVESTER, PHOTOCONDUCTIVE ANTENNA, ARRAY ANTENNA AND RECTENNA

BACKGROUND

Technical Field

The present disclosure relates to a Duo Aloe Vera Cruces Concentricis antenna structure, an electromagnetic wave energy absorber, a thermoelectric energy harvester, a photoconductive antenna, an array antenna and a rectenna. More particularly, the present disclosure relates to an ultra-wideband omnidirectional and polarization insensitive Duo Aloe Vera Cruces Concentricis antenna structure applied to an electromagnetic wave energy absorber, a thermoelectric energy harvester, a photoconductive antenna, an array antenna and a rectenna.

Description of Related Art

The power is often the limiting factor, as the modern society is being highly dependent on battery sources for ultra-low power electronic devices. This leads to the tedious task of disposing and replacing large numbers of batteries that cause environmental pollution. Ambient electromagnetic (EM) energy harvesting offers a green and sustainable approach to this problem. To date, numerous approaches have been investigated for collecting such freely available EM radiation energy. Among them, some of the research groups proposed and experimentally demonstrated mechanically flexible, strongly polarization independent and near unity broadband absorbers. However, the structures of the broadband absorbers in prior art can only work within a limited frequency band, which limits their practical applications.

The concept of capturing EM energy using antenna has been around few decades. This involves collecting ambient EM radiation and converts it into electrical energy for powering the low power electronic devices. An energy harvester can do the job to convert such ambient EM energy into useable electrical energy. Among all the visible energy harvesting is primarily implemented on an industrial scale using photovoltaic (PV) and thermal solar cells. However, these cells suffer from performance due to certain factors such as narrowband absorption, bad weather and only daytime supply of visible light. Therefore, an alternative approach that can alleviate such problems is highly desirable. Moreover, the traditional solar cells are not collecting most of the solar radiation in the IR region. In order to deal with the current renewable energy crisis, collect waste heat at infrared wavelengths and even longer wavelengths and turn it into usable energy is highly desirable.

In view of the problems, how to establish the perfect broadband absorbers minimizing reflection and transmission and maximizing the absorption bandwidth in the broad frequency range are indeed highly anticipated by the public and become the goal and the direction of relevant industry efforts.

SUMMARY

According to one aspect of the present disclosure, a Duo Aloe Vera Cruces Concentricis antenna structure includes a first conductive layer, a dielectric layer and a second conductive layer. The first conductive layer includes a plurality of first metal units and a plurality of second metal units. The first metal units are arranged around each other to form a first tapered hole. The second metal units are located in the first tapered hole and arranged around each other to form a second tapered hole. The dielectric layer is connected to the first conductive layer, and includes a plurality of metal units and a plurality of fourth units. The third units are aligned with the first metal units, respectively.

The fourth units are aligned with the second metal units, respectively. The second conductive layer is connected to the dielectric layer. The dielectric layer is located between the first conductive layer and the second conductive layer. The first tapered hole has at least one first center line passed through a center of the first tapered hole. The second tapered hole has at least one second center line passed through a center of the second tapered hole. An included angle between the at least one first center line and the at least one second center line is 45 degrees.

According to another aspect of the present disclosure, an electromagnetic wave energy absorber includes a nanoantenna. The nanoantenna includes at least one Duo Aloe Vera Cruces Concentricis antenna structure of the aforementioned aspect. The nanoantenna is configured to absorb an incident radiation, and a frequency of the incident radiation is f, and the following condition is satisfied: 25 THz$<$f$\leq$800 THz.

According to one another aspect of the present disclosure, a thermoelectric energy harvester includes a first conductive layer, a dielectric layer, a second conductive layer, a contact electrode and a coaxial cable. The first conductive layer receives a heat radiation, and includes a plurality of first metal units and a plurality of second metal units. The first metal units are arranged around each other to form a first tapered hole. The second metal units are located in the first tapered hole and arranged around each other to form a second tapered hole. The dielectric layer is connected to the first conductive layer. The second conductive layer is connected to the dielectric layer. The dielectric layer is located between the first conductive layer and the second conductive layer. The contact electrode is disposed through the dielectric layer and electrically connected between the first conductive layer and the second conductive layer. The coaxial cable is electrically connected to the contact electrode and converts the heat radiation into a direct current according to a Seebeck effect. The first tapered hole has at least one first center line passed through a center of the first tapered hole. The second tapered hole has at least one second center line passed through a center of the second tapered hole. An included angle between the at least one first center line and the at least one second center line is 45 degrees.

According to still another aspect of the present disclosure, a photoconductive antenna is configured to replace one of a spiral antenna and a bow tie antenna. The photoconductive antenna includes the first conductive layer of the Duo Aloe Vera Cruces Concentricis antenna structure of the aforementioned aspect, a photo-absorbing semiconductor layer and the second conductive layer of the Duo Aloe Vera Cruces Concentricis antenna structure of the aforementioned aspect. The photo-absorbing semiconductor layer is connected to the first conductive layer, and a structure of the photo-absorbing semiconductor layer is same as a structure of the dielectric layer of the Duo Aloe Vera Cruces Concentricis antenna structure of the aforementioned aspect. The second conductive layer is connected to the photo-absorbing semiconductor layer, and the photo-absorbing semiconductor layer is located between the first conductive layer and the second conductive layer.

According to still another aspect of the present disclosure, an array antenna includes a plurality of the Duo Aloe Vera Cruces Concentricis antenna structure of the aforementioned aspect. A plurality of the first conductive layers of the Duo Aloe Vera Cruces Concentricis antenna structures are arranged at intervals. A plurality of the dielectric layers of the Duo Aloe Vera Cruces Concentricis antenna structures are arranged at intervals. A plurality of the second conductive layers of the Duo Aloe Vera Cruces Concentricis antenna structure are connected to each other or formed integrally.

According to still another aspect of the present disclosure, a rectenna is used for a communication or an energy harvesting device and includes the Duo Aloe Vera Cruces Concentricis antenna structure of the aforementioned aspect and a rectifier module. The Duo Aloe Vera Cruces Concentricis antenna structure receives a radio frequency signal or a radiation. The rectifier module is electrically connected to the Duo Aloe Vera Cruces Concentricis antenna structure and converts the radio frequency signal or the radiation from an alternating current into a direct current.

BRIEF DESCRIPTION OF THE DRAWINGS

The present disclosure can be more fully understood by reading the following detailed description of the embodiment, with reference made to the accompanying drawings as follows.

DETAILED DESCRIPTION

The embodiment will be described with the drawings. For clarity, some practical details will be described below. However, it should be noted that the present disclosure should not be limited by the practical details, that is, in some embodiment, the practical details is unnecessary. In addition, for simplifying the drawings, some conventional structures and elements will be simply illustrated, and repeated elements may be represented by the same labels.

It will be understood that when an element (or device) is referred to as be "connected to" another element, it can be directly connected to the other element, or it can be indirectly connected to the other element, that is, intervening elements may be present. In contrast, when an element is referred to as be "directly connected to" another element, there are no intervening elements present. In addition, the terms first, second, third, etc. are used herein to describe various elements or components, these elements or components should not be limited by these terms. Consequently, a first element or component discussed below could be termed a second element or component.

Figure 1A:
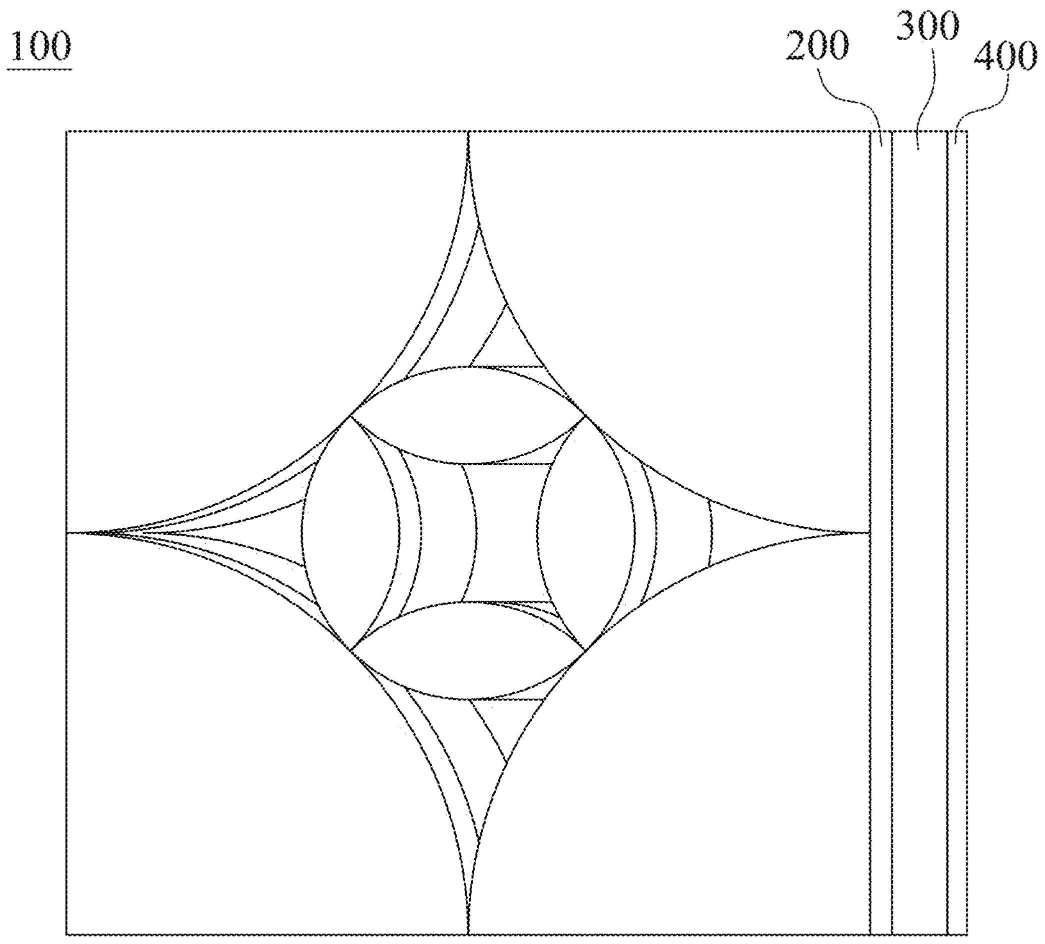
FIG. 1A shows a three-dimensional schematic view of a Duo Aloe Vera Cruces Concentricis antenna structure according to the first embodiment of the present disclosure.
Figure 1B:
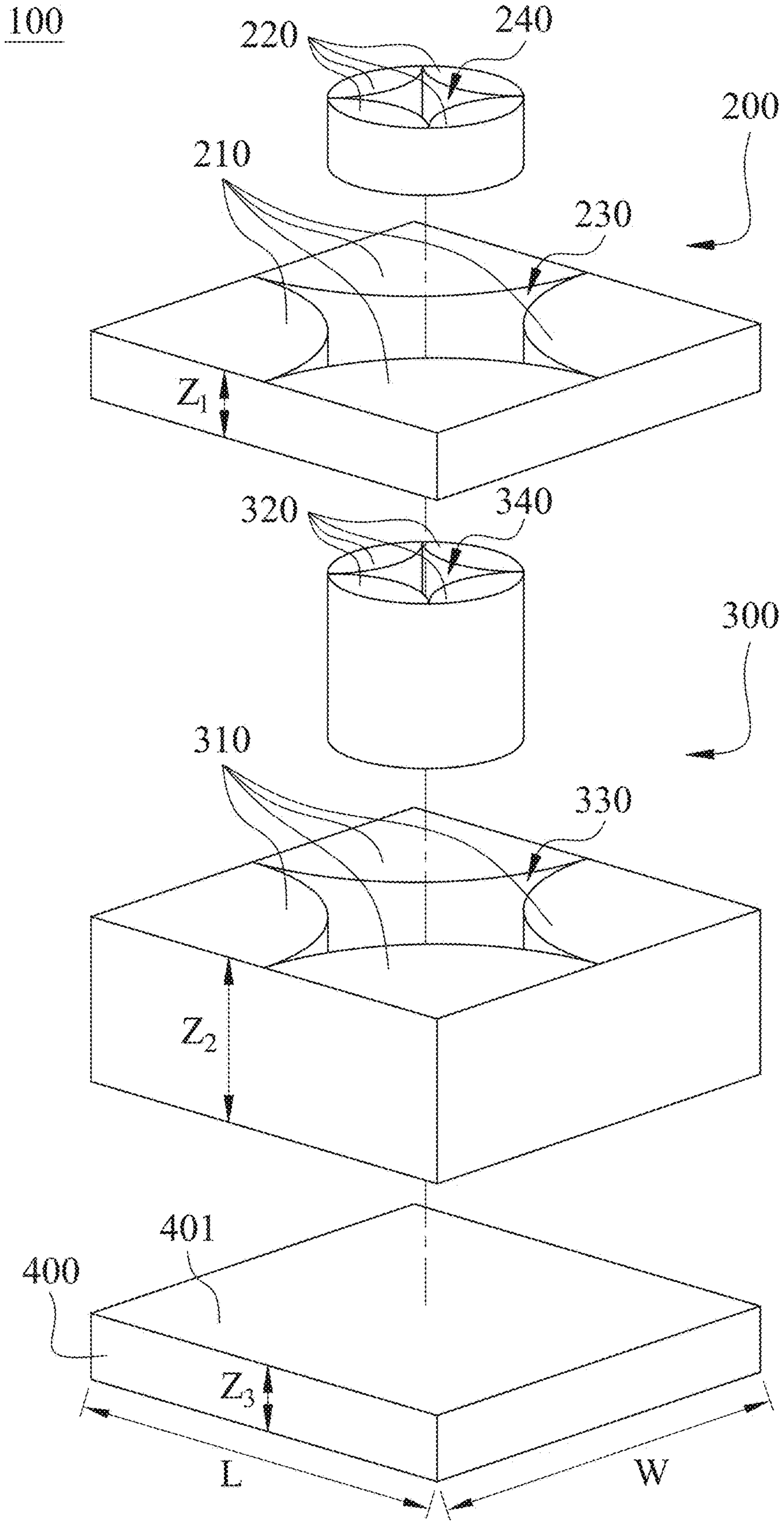
FIG. 1B shows an exploded view of the Duo Aloe Vera Cruces Concentricis antenna structure of FIG. 1A.
Figure 1C:
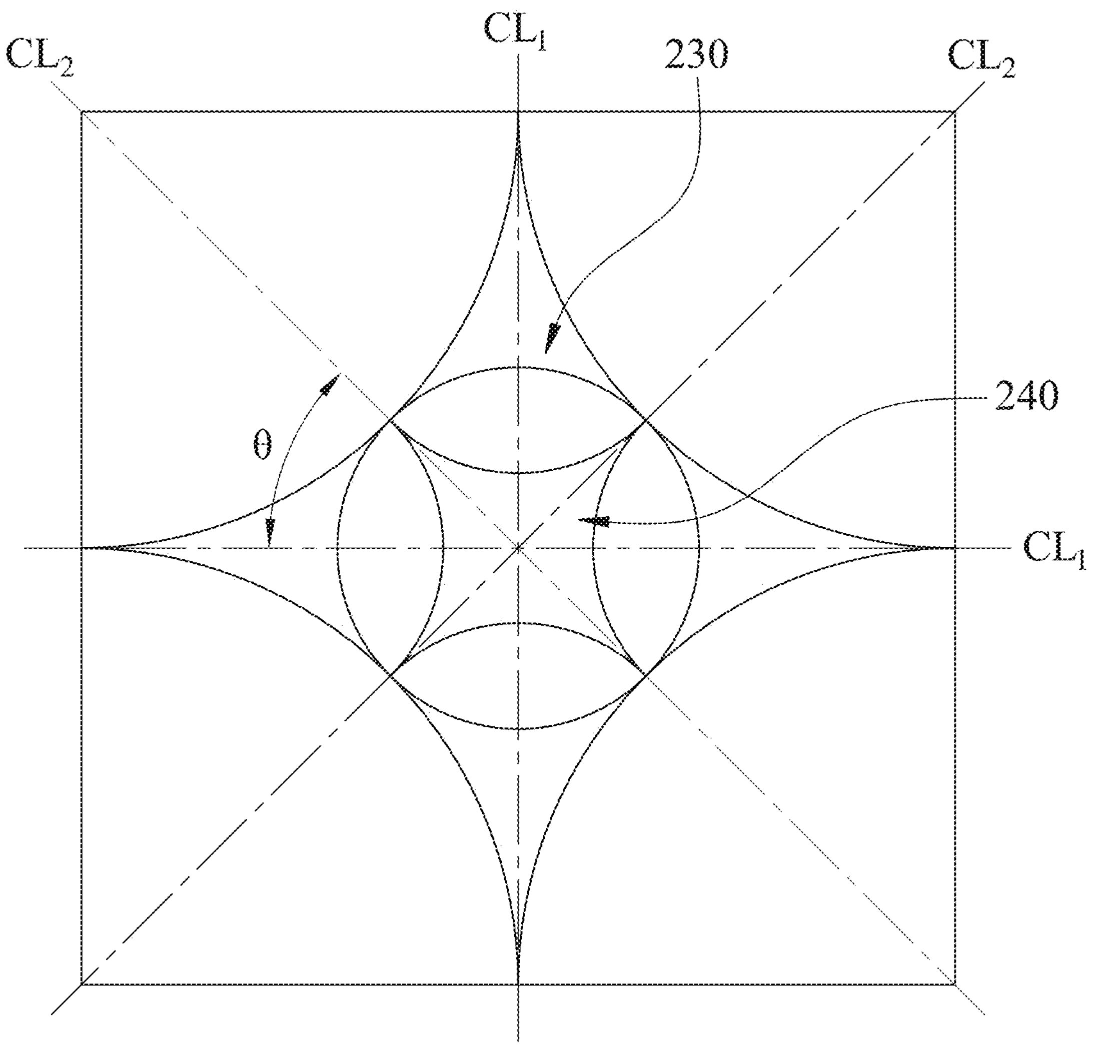
FIG. 1C shows a top view of the Duo Aloe Vera Cruces Concentricis antenna structure of FIG. 1A.

Please refer to FIG. 1A, FIG. 1B and FIG. 1C. FIG. 1A shows a three-dimensional schematic view of a Duo Aloe Vera Cruces Concentricis antenna structure 100 according to the first embodiment of the present disclosure. FIG. 1B shows an exploded view of the Duo Aloe Vera Cruces Concentricis antenna structure 100 of FIG. 1A. FIG. 1C shows a top view of the Duo Aloe Vera Cruces Concentricis antenna structure 100 of FIG. 1A. In FIGS. 1A, 1B and 1C, the Duo Aloe Vera Cruces Concentricis antenna structure 100 includes a first conductive layer 200, a dielectric layer 300 and a second conductive layer 400.

The first conductive layer 200 includes a plurality of first metal units 210 and a plurality of second metal units 220. The first metal units 210 are arranged around each other to form a first tapered hole 230. The second metal units 220 are located in the first tapered hole 230 and arranged around each other to form a second tapered hole 240.

The dielectric layer 300 is connected to the first conductive layer 200, and includes a plurality of third units 310 and a plurality of fourth units 320. The third units 310 are arranged around each other to form a third tapered hole 330. The fourth units 320 are located in the third tapered hole 330 and arranged around each other to form a fourth tapered hole 340. In addition, the third units 310 are aligned with the first metal units 210, respectively. The fourth units 320 are aligned with the second metal units 220, respectively.

The second conductive layer 400 is connected to the dielectric layer 300. The dielectric layer 300 is located between the first conductive layer 200 and the second conductive layer 400. The second conductive layer 400 can include a surface 401. Each of the first metal units 210 and each of the third units 310 are laminated and cover the surface 401, and each of the second metal units 220 and each of the fourth units 320 are laminated and cover the surface 401; in other words, the pattern of the first conductive layer 200 is the same as the pattern of the dielectric layer 300.

It is worth explaining that the first tapered hole 230 has at least one first center line $CL_1$ passed through a center of the first tapered hole 230. The second tapered hole 240 has at least one second center line $CL_2$ passed through a center of the second tapered hole 240. The center of the first tapered hole 230 and the center of the second tapered hole 240 are the same, and the center is located at the middle of the first conductive layer 200. In detail, a number of the at least one first center line $CL_1$ can be two, and a number of the at least one second center line $CL_2$ can be two. The two first center lines $CL_1$ are perpendicular to each other, and the two second center lines $CL_2$ are perpendicular to each other. It is worth noting that, an included angle θ between the at least one first center line $CL_1$ and the at least one second center line $CL_2$ is 45 degrees. As same as the first conductive layer 200, the third tapered hole 330 in the dielectric layer 300 has at least one third center line (not shown) passed through a center of the third tapered hole 330, the fourth tapered hole 340 in the dielectric layer 300 has at least one fourth center line (not shown) passed through a center of the fourth tapered hole 340, and an included angle between the at least one third center line and the at least one fourth center line is 45 degrees.

In particular, the Duo Aloe Vera Cruces Concentricis antenna structure 100 of the present disclosure can be applied to an electromagnetic (EM) wave absorber for EM energy harvesting. Perfect EM wave absorber is a device in which all incident radiation is absorbed efficiently at the operating wavelengths. Once the radiation is absorbed by the device, it transformed into ohmic heat or other form of energies. Thus, reflection, transmission, scattering and all other waves propagation are not observed as they pass through the perfect EM wave absorber. In general, the conventional absorbers are made of materials with high intrinsic losses, but the Duo Aloe Vera Cruces Concentricis antenna structure 100 of the present disclosure can be mainly made of noble metals.

In detail, the first conductive layer 200 consists of lossy metal nickel (Ni). The dielectric layer 300 consists of a passive dielectric material or a highly insulated material, and the highly insulated material is SU-8. The second conductive layer 400 consists of lossy metal gold (Au). The first conductive layer 200 and the dielectric layer 300 are patterned whereas the second conductive layer 400 does not pattern, instead it is kept continuous layer to avoid transmission of EM waves. The dielectric layer 300 is sandwiched between the first conductive layer 200 and the second conductive layer 400. Properties of the aforementioned materials are listed in Table 1, and the present disclosure is not limited thereto.

TABLE 1

| | Materials | | |
|---|---|---|---|
| Properties | Gold (Au) | Nickel (Ni) | SU-8 |
| Relative permittivity ($\varepsilon_r$) | | | 2.8 |
| Relative permeability ($\mu_r$) | 1 | 600 | 1 |
| Electrical conductivity ($\sigma$) | 4.10e+07 | 1.64e+07 | |
| Thermal conductivity (k) | 314 | 91 | 0.2 |
| Density ($\rho$) | 19320 | 8900 | 1200 |
| Heat capacity ($C_p$) | 0.13 | 0.45 | 1.6 |
| Young modulus (Y) | 78 | 207 | 4.02 |
| Poisson's ratio (P) | 0.42 | 0.31 | 0.22 |
| Thermal expansion coefficient ($\alpha$) | 14.1 | 13.3 | 87.1 |

Further, a thickness of the first conductive layer 200 is $Z_1$, a thickness of the dielectric layer 300 is $Z_2$, a thickness of the second conductive layer 400 is $Z_3$, and the following condition is satisfied: $Z_1=Z_3\leq Z_2$. The thickness $Z_1$ of the first conductive layer 200 is greater than a skin depth of the first conductive layer 200, the thickness $Z_2$ of the dielectric layer 300 is greater than a penetration depth of the dielectric layer 300, and the thickness $Z_3$ of the second conductive layer 400 is greater than a skin depth of the second conductive layer 400. In the first embodiment, the thickness $Z_1$ of the first conductive layer 200 and the thickness $Z_3$ of the second conductive layer 400 are 200 nm. The thickness $Z_2$ of the dielectric layer 300 is 500 nm with a relative permittivity (Er) of 2.8. The overall thickness of the Duo Aloe Vera Cruces Concentricis antenna structure 100 is 900 nm. Both of a length L and a width W of the Duo Aloe Vera Cruces Concentricis antenna structure 100 are 1000 nm, but the present disclosure is not limited thereto.

Figure 2A:
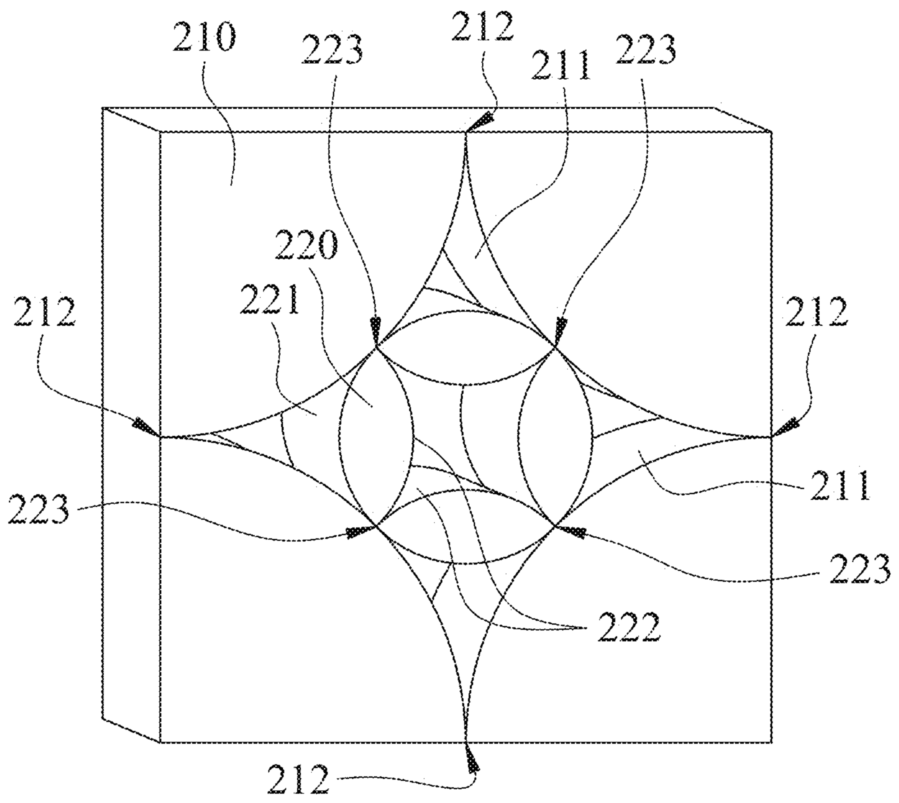
FIG. 2A shows a three-dimensional schematic view of the first conductive layer of the Duo Aloe Vera Cruces Concentricis antenna structure of FIG. 1A.
Figure 2B:
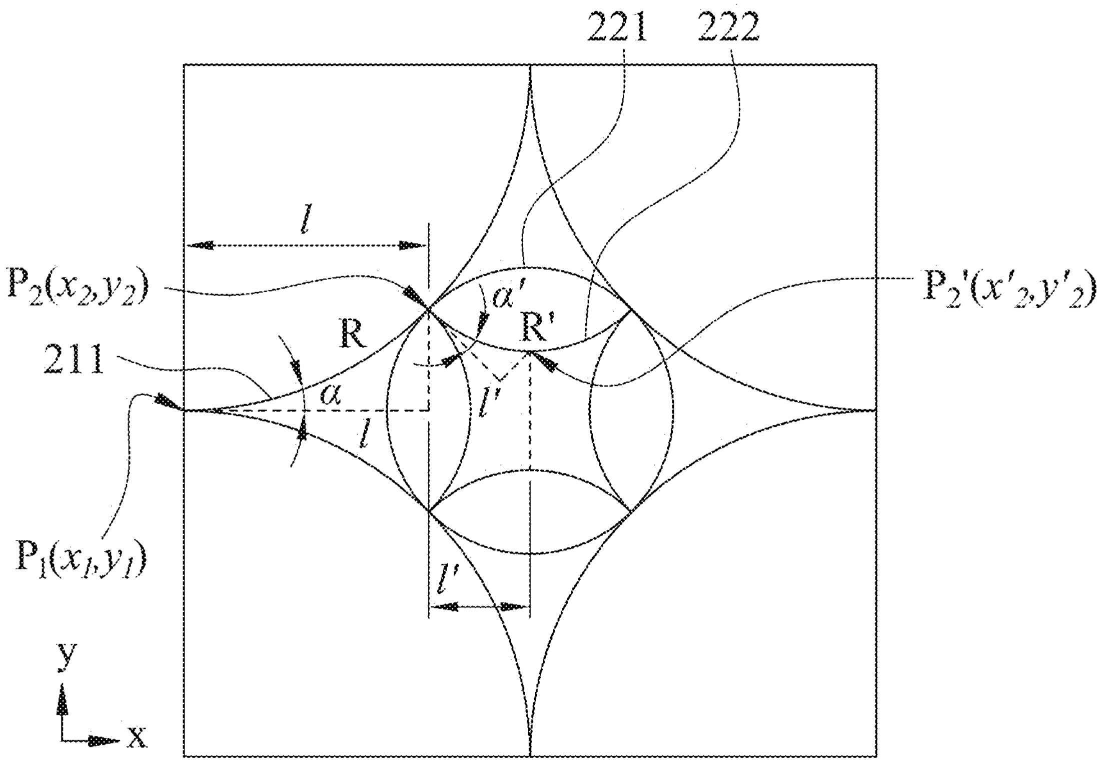
FIG. 2B shows a top view (in a x-y plane) of the first conductive layer of FIG. 2A.

Please refer to FIG. 1C, FIG. 2A and FIG. 2B. FIG. 2A shows a three-dimensional schematic view of the first conductive layer 200 of the Duo Aloe Vera Cruces Concentricis antenna structure 100 of FIG. 1A. FIG. 2B shows a top view (in a x-y plane) of the first conductive layer 200 of FIG. 2A. As shown in FIG. 1C and FIG. 2A, each of the first metal units 210 can include a curved surface 211. The curved surfaces 211 of each two of the first metal units 210 adjacent to each other are connected to each other. The curved surfaces 211 of the first metal units 210 form four peaks 212. Two of the peaks 212 are located on one of the first center lines $CL_1$, and another two of the peaks 212 are located on the other of the first center lines $CL_1$.

Further, each of the second metal units 220 can include an outer curved surface 221 and an inner curved surface 222. The outer curved surface 221 and the inner curved surface 222 form a leaf pattern on the surface of the first conductive layer 200. The inner curved surfaces 222 of each two of the second metal units 220 adjacent to each other are connected to each other. The inner curved surfaces 222 of the second metal units 220 form four peaks 223, two of the peaks 223 are located on one of the second center lines $CL_2$, and another two of the peaks 223 are located on the other of the second center lines $CL_2$.

In detail, the structure of the first conductive layer 200 is tapered in such a way that generates four identical flower petals (i.e., the first metal units 210). The identical flower petals are around four identical leaf patterns (i.e., the second metal units 220) in the center of the first conductive layer 200. Each of the second metal units 220 near the center of the first conductive layer 200 is planned by using six spline curves in SOLIDWORKS®, and then the structure formed by the second metal units 220 is rotated by 90° relative to the structure formed by the first metal units 210. In the same way, the structure of the dielectric layer 300 is not described again herein. Therefore, such tapered structure of the Duo Aloe Vera Cruces Concentricis antenna structure 100 of the present disclosure can combine with a nanoantenna to confine Infrared (IR), entire visible and part of UV-visible band. In addition, the Duo Aloe Vera Cruces Concentricis antenna structure 100 includes a Metal-Dielectric-Metal (MDM) configuration in which both the first conductive layer 200 and the dielectric layer 300 are tapered to generate a groove-like structure (e.g., Duo Aloe Vera cruces Concentricis, in Latin language) which can confine and cover the wavelength of different frequencies. Due to the symmetry of the structure of the Duo Aloe Vera Cruces Concentricis antenna structure 100, it allows polarization not to be a factor in the detection of plane waves. The second metal units 220 inside the first conductive layer 200 cover the higher frequency regime whereas the first metal units 210 outside the first conductive layer 200 cover the lower frequency regime for the absorption of EM waves. The Duo Aloe Vera Cruces Concentricis antenna structure 100 of the present disclosure is described in more detail with the drawing and the embodiment below.

A taper structure of the first conductive layer 200 is defined as exponential curves in the x-y plane as shown in FIG. 2B. For each of the first metal units 210, a profile of the curved surface 211 can be an exponential taper. The exponential taper is defined by an opening rate R and two points $P_1$, $P_2$ in the x-y plane and satisfies a plurality of following equations (1), (2) and (3):

$$y = c_1 e^{Rx} + C_2; \tag{1}$$

$$c_1 = \frac{y_2 - y_1}{e^{Rx_2} - e^{Rx_1}}; \tag{2}$$

$$c_2 = \frac{y_1 e^{Rx_2} - y_2 e^{Rx_1}}{e^{Rx_2} - e^{Rx_1}}. \tag{3}$$

In the equations (1), (2) and (3), the opening rate R is represented as R. A x-coordinate of the x-y plane is represented as x. A y-coordinate of the x-y plane is represented as Y. A x-coordinate of the point $P_1$ is represented as $x_1$. A y-coordinate of the point $P_1$ is represented as $y_1$. A x-coordinate of the point $P_2$ is represented as $x_2$. A y-coordinate of the point $P_2$ is represented as $y_2$. A first variable value is represented as 1, and a second variable value is represented as $C_2$.

As shown in FIG. 2B, a taper length l is $x_2-x_1$. For the profile of the curved surface 211, the opening rate R varies from 0 to 0.7. In the limiting case where the opening rate R approaches zero, the exponential taper results in a so-called linearly tapered slot antenna for which a taper slope is constant. For example, in response to determining that the taper slope of the exponential taper at R≅0 is represented as S. A first taper slope of the exponential taper at $x=x_1$ is represented as 51. A second taper slope of the exponential taper at $x=x_2$ is represented as 32. A taper flare angle of the exponential taper is represented as a, and a plurality of following equations (4), (5) and (6) are satisfied:

$$S = \frac{y_2 - y_1}{x_2 - x_1}; \tag{4}$$

$$S_1 < S < S_2; \tag{5}$$

$$\alpha = \tan^{-1} S. \tag{6}$$

For the exponential taper defined by the equation (1), the taper slope (i.e., S) changes continuously from $S_1$ to $S_2$, where $S_1$ and $S_2$ are the taper slopes at $x=x_1$ and at $x=x_2$, respectively, and $S_1<S<S_2$ for R>0.

In the same way, for each of the second metal units 220, a profile of both the outer curved surface 221 and the inner curved surface 222 can also be another exponential taper. The another exponential taper is defined by an opening rate R' and two points $P_2$, $P_2'$ in the x-y plane and satisfies a plurality of following equations (7), (8) and (9):

$$y = c_1' e^{R'x} + c_2'; \tag{7}$$

$$c_1' = \frac{y_2' - y_2}{e^{R'x_2'} - e^{R'x_2}}; \tag{8}$$

$$c_2' = \frac{y_2 e^{R'x_2'} - y_2' e^{R'x_2}}{e^{R'x_2'} - e^{R'x_2}}. \tag{9}$$

In the equations (7), (8) and (9), the opening rate R' is represented as R'. A x-coordinate of the x-y plane is represented as x. A y-coordinate of the x-y plane is represented as Y. A x-coordinate of the point $P_2$ is represented as $x_2$. A y-coordinate of the point $P_2$ is represented as 2. A x-coordinate of the point $P_2'$ is represented as $x_2'$. A y-coordinate of the point $P_1$ is represented as $y_2'$. A first variable value is represented as $C_1'$, and a second variable value is represented as $C_2'$.

As shown in FIG. 2B, a taper length l' is $x_2-x_2$. For the profile of the outer curved surface 221, the opening rate R' varies from 0 to 0.7 as same as the opening rate R corresponding to the profile of the curved surface 211. In response to determining that a taper slope of the another exponential taper at R'≅0 is represented as S'. A first taper slope of the another exponential taper at $x=x_2$ is represented as $S_1$. A second taper slope of the another exponential taper at $x=x_2$ is represented as $S_2$. A taper flare angle of the another exponential taper is represented as a', and a plurality of following equations (10), (11) and (12) are satisfied:

$$S' = \frac{y_2' - y_2}{x_2' - x_2}; \tag{10}$$

$$S_1' < S' < S_2'; \tag{11}$$

$$\alpha' = \tan^{-1} S'. \tag{12}$$

For the another exponential taper defined by the equation (7), the taper slope (i.e., S') changes continuously from $S_1'$ to $S_2'$, where $S_1'$ and $S_2'$ are the taper slopes at $x=x_2$ and at $x=x_2'$, respectively, and $S_1'<S'<S_2'$ for R'>0. The parameters and dimensions of the first conductive layer 200 are listed in Table 2, and the present disclosure is not limited thereto.

TABLE 2

| Parameters | Dimensions |
|---|---|
| l | 360 nm |
| l' | 140 nm |
| α | 10.7° |
| α' | 15.8° |
| S | 0.18 |
| S' | 0.28 |

Figure 3:
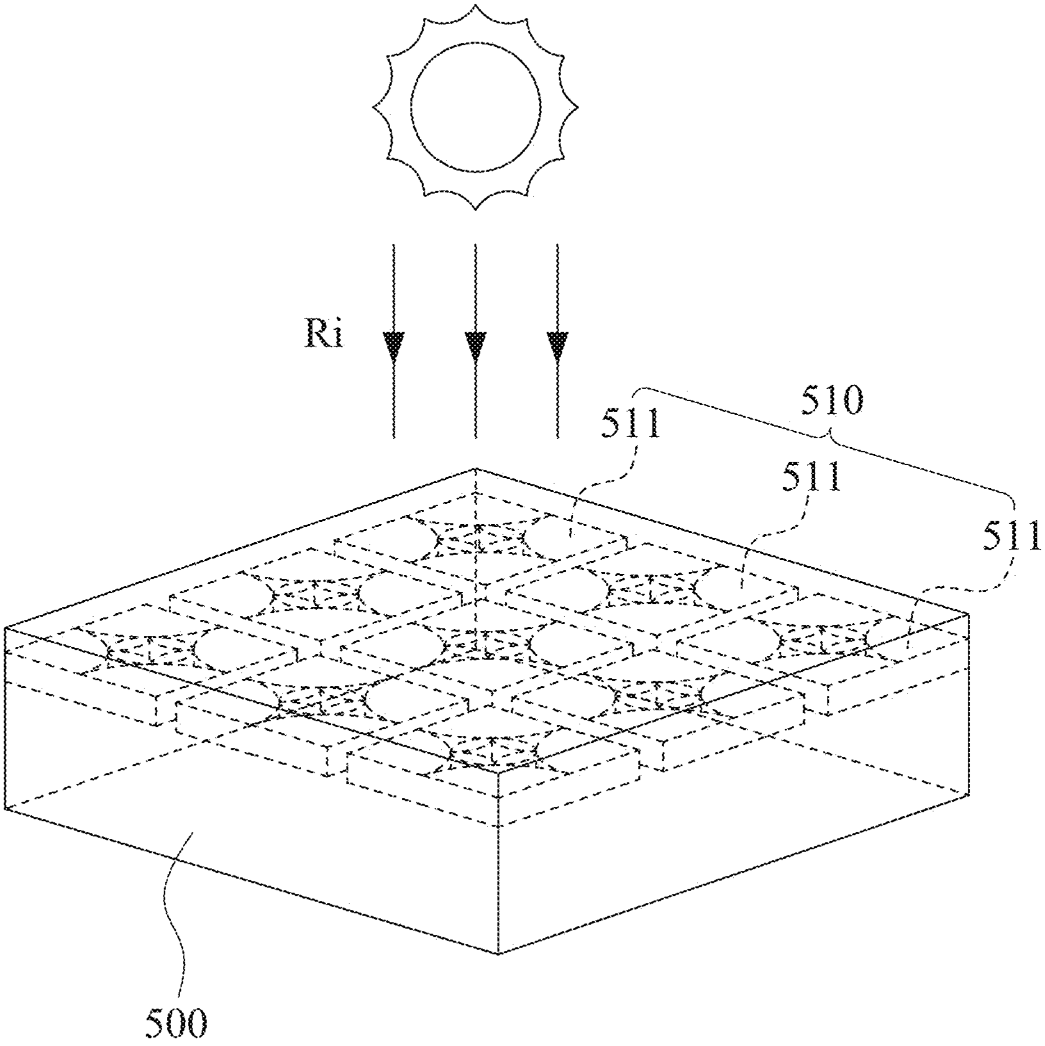
FIG. 3 shows a schematic view of an electromagnetic wave energy absorber according to the second embodiment of the present disclosure.

Please refer to FIG. 3. FIG. 3 shows a schematic view of an electromagnetic wave energy absorber 500 according to the second embodiment of the present disclosure. The electromagnetic wave energy absorber 500 includes a nanoantenna 510. The nanoantenna 510 includes at least one Duo Aloe Vera Cruces Concentricis antenna structure 511. In the second embodiment, a number of the at least one Duo Aloe Vera Cruces Concentricis antenna structure 511 can be plural, and each of the Duo Aloe Vera Cruces Concentricis antenna structures 511 is the same as the Duo Aloe Vera Cruces Concentricis antenna structure 100 of the first embodiment. The nanoantenna 510 is configured to absorb an incident radiation Ri, and a frequency of the incident radiation Ri is f, and the following condition is satisfied: 25 THz<f≤800 THz. The incident radiation Ri is incident on the nanoantenna 510 in a normal direction, and the nanoantenna 510 has an average absorption corresponding to the incident radiation Ri. The average absorption is AA, and the following condition is satisfied: 84.5%≤AA. In particular, the nanoantenna 510 is based on the Duo Aloe Vera Cruces Concentricis antenna structure 100, and numerically analyzed to show that it is a promising candidate for energy harvesting applications in Infrared (IR) to Ultraviolet (UV) regime. The effects of the electromagnetic wave energy absorber 500 on the absorption performance are tested and simulated to show a high performance in both bandwidth and absorptivity (average absorption of 83.4-84.5% spanning a broad range from IR to visible, i.e., from 25 THz to 800 THz, as shown FIG. 7A and FIG. 7B in the following paragraph). In other embodiments, the Duo Aloe Vera Cruces Concentricis antenna structure 511 can also be used in an energy harvesting device using in an antenna. For example, broadband energy harvesting combing with the antenna can be achieved by direct RF energy harvesting to DC using rectifier, Thermoelectric, Bolometer, Pyroelectric or Quantum type detector such as InGaAs and photoconductive materials.

Figure 4:
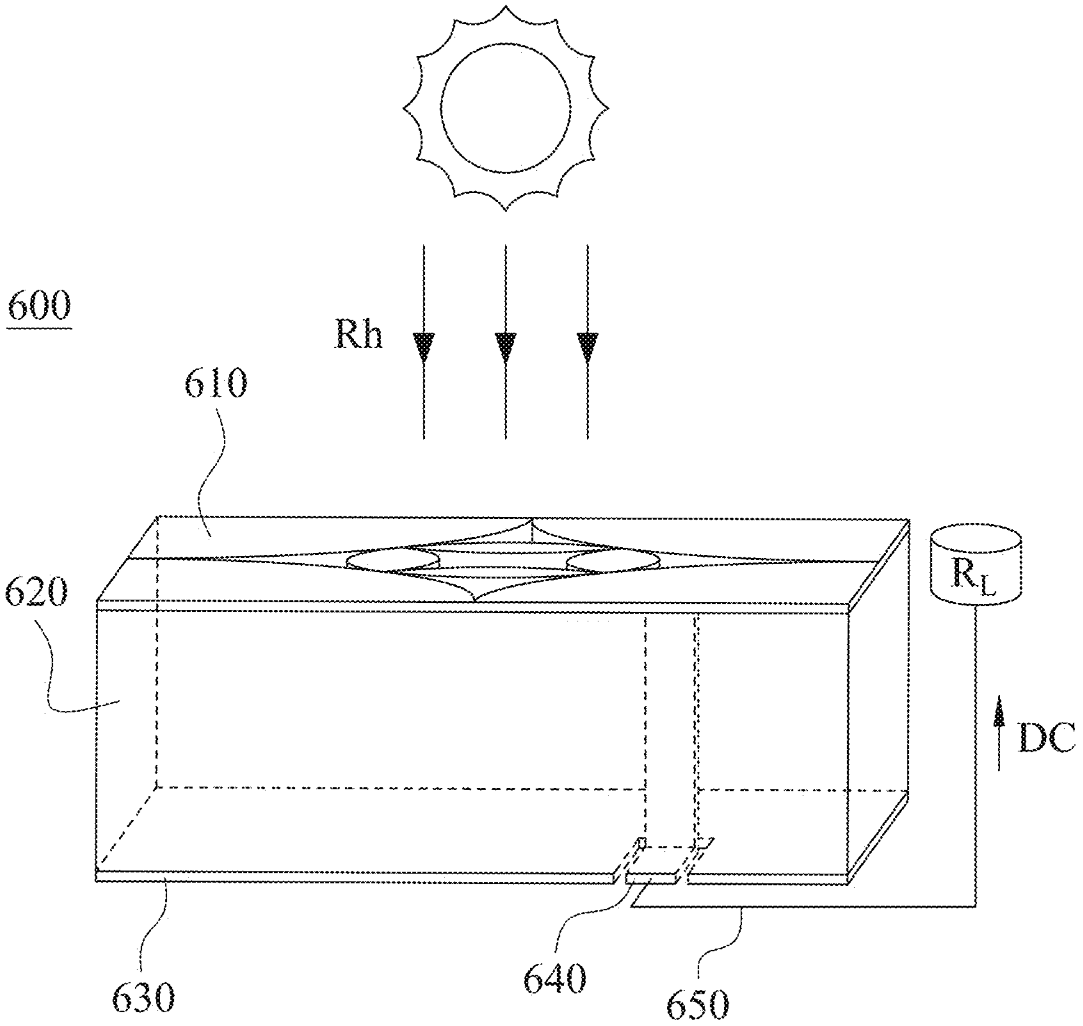
FIG. 4 shows a schematic view of a thermoelectric energy harvester according to the third embodiment of the present disclosure.

Please refer to FIG. 4. FIG. 4 shows a schematic view of a thermoelectric energy harvester 600 according to the third embodiment of the present disclosure. The thermoelectric energy harvester 600 includes a first conductive layer 610, a dielectric layer 620, a second conductive layer 630, a contact electrode 640 and a coaxial cable 650. The structural configuration among the first conductive layer 610, the dielectric layer 620 and the second conductive layer 630 have the same structural configuration as the elements corresponding to the Duo Aloe Vera Cruces Concentricis antenna structure 100 of the first embodiment, and are not be described again herein. However, the dimensions of the first conductive layer 610, the dielectric layer 620 and the second conductive layer 630 can be the same or different from the elements corresponding to the Duo Aloe Vera Cruces Concentricis antenna structure 100 of the first embodiment.

It should be noted that the dielectric layer 620 in FIG. 4 is a perspective view. The first conductive layer 610 receives a heat radiation Rh. The contact electrode 640 is disposed through the dielectric layer 620 and electrically connected between the first conductive layer 610 and the second conductive layer 630. The coaxial cable 650 is electrically connected to the contact electrode 640 and converts the heat radiation Rh into a direct current DC according to a Seebeck effect (Diffusion of electrons due to the heat radiation Rh). The direct current DC is delivered to a load $R_L$ and provides a power source for the load $R_L$.

The thermoelectric energy harvester 600 can be a portable or wearable thermoelectric generator, which uses the flexible conductive thermoelectric materials and the ultra-wideband antenna as one of the heat receiving end of thermoelectric (TE) module so that ambient energy from the surrounding can be captured. The TE module is basically a circuit consists of two distinct thermoelectric materials that when combine can generate electricity from heat directly. The TE module consists of two dissimilar thermoelectric materials joining in their ends. One end makes of an N-type (electron rich) semiconductor, the other one makes of a P-type (electron lacking) semiconductor. In detail, the first conductive layer 610 consists of a P-type semiconductor, and the second conductive layer 630 consists of an N-type semiconductor. In particular, the P-type semiconductor of the first conductive layer 610 consists of nickel or one of a plurality of P-type conductive materials, and the N-type semiconductor of the second conductive layer consists of gold or one of a plurality of N-type conductive materials. The first conductive layer 610 utilizes the two concentric tapering crosses structure as a heat receiving end of the thermoelectric energy harvester 600 to improve energy absorption and frequency range.

Figure 5:
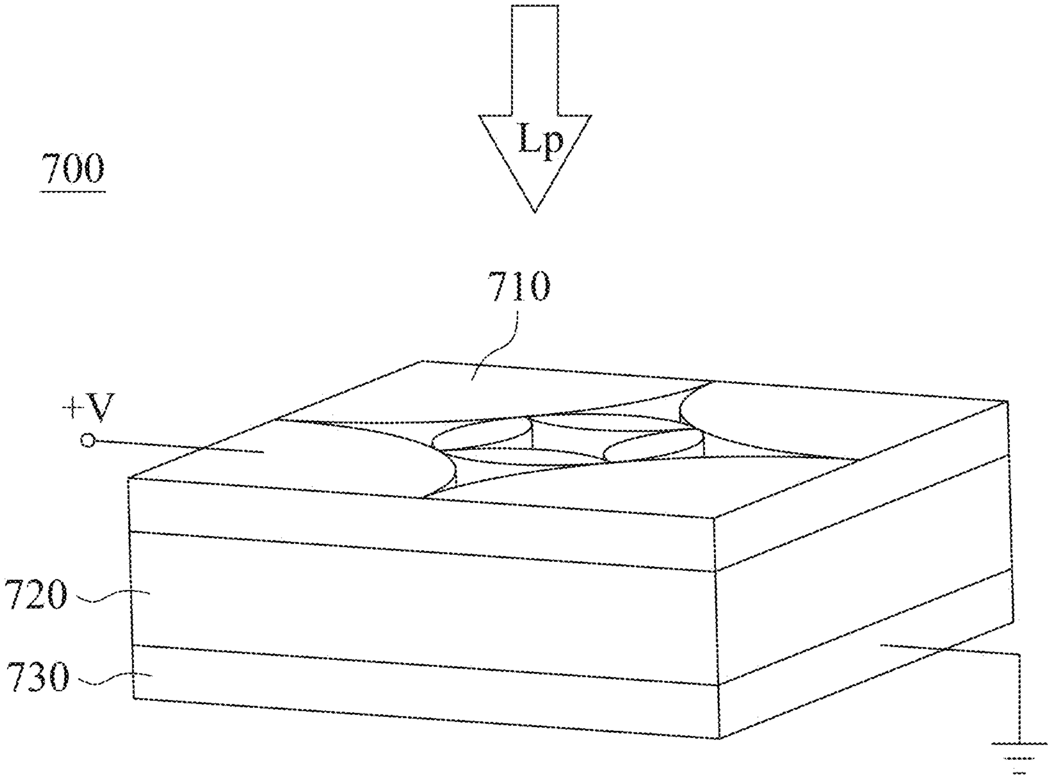
FIG. 5 shows a schematic view of a photoconductive antenna according to the fourth embodiment of the present disclosure.

Please refer to FIG. 5. FIG. 5 shows a schematic view of a photoconductive antenna 700 according to the fourth embodiment of the present disclosure. The photoconductive antenna 700 includes a first conductive layer 710, a photo-absorbing semiconductor layer 720 and a second conductive layer 730, and is configured to replace one of a spiral antenna (not shown) and a bow tie antenna (not shown). The first conductive layer 710 is the same as the first conductive layer 200 of the Duo Aloe Vera Cruces Concentricis antenna structure 100 of the first embodiment. The photo-absorbing semiconductor layer 720 is connected to the first conductive layer 710, and a structure of the photo-absorbing semiconductor layer 720 is the same as a structure of the dielectric layer 300 of the Duo Aloe Vera Cruces Concentricis antenna structure 100 of the first embodiment. The second conductive layer 730 is connected to the photo-absorbing semiconductor layer 720, and a structure of the second conductive layer 730 is the same as a structure of the second conductive layer 400 of the Duo Aloe Vera Cruces Concentricis antenna structure 100 of the first embodiment. The photo-absorbing semiconductor layer 720 is located between the first conductive layer 710 and the second conductive layer 730. In short, the structural configuration among the first conductive layer 710, the photo-absorbing semiconductor layer 720, the second conductive layer 730 have the same structural configuration as the first conductive layer 200, the dielectric layer 300 and the second conductive layer 400 of the Duo Aloe Vera Cruces Concentricis antenna structure 100 of the first embodiment, and are not be described again herein. As shown in FIG. 5, the photoconductive antenna 700 receives a laser pulse Lp, and the laser pulse Lp excites carriers which are accelerated by a potential +V. The resulting charge separation causes dipole emission of terahertz frequencies.

In detail, the photoconductive antenna 700 basically uses the photoductive effects to generate the electrical energy, and transmits and receives the radiation (normally in THz region). The photoconductive antenna 700 consists of a metal antenna (i.e., the first conductive layer 710 and the photo-absorbing semiconductor layer 720) patterned on a photoconductive substrate (i.e., the second conductive layer 730). In the fourth embodiment, the photoconductive antenna 700 is not used as an energy harvesting device, but used as a transceiver system.

Figure 6:
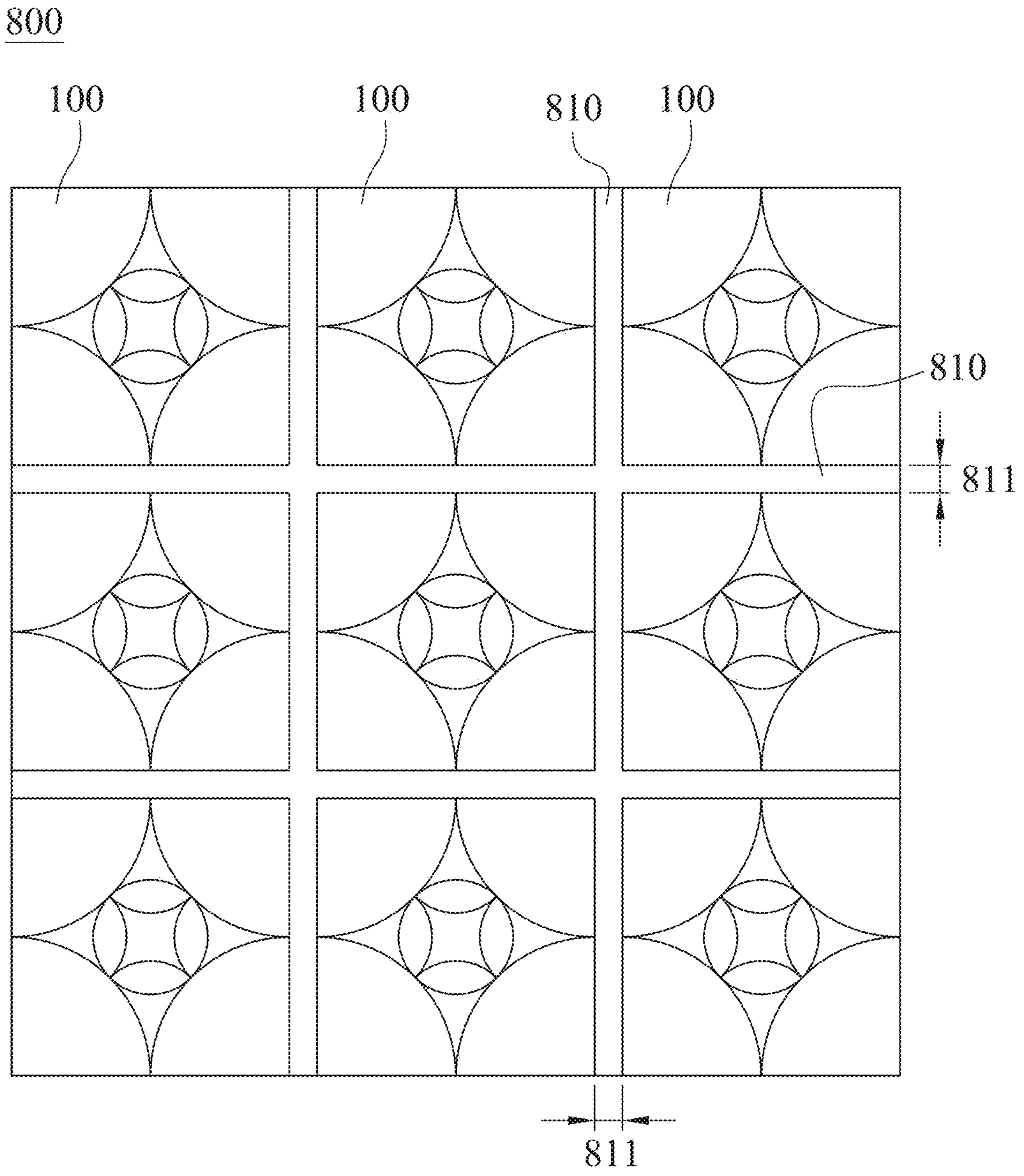
FIG. 6 shows a two-dimensional schematic view of an array antenna according to the fifth embodiment of the present disclosure.

Please refer to FIG. 1A and FIG. 6. FIG. 6 shows a two-dimensional schematic view of an array antenna 800 according to the fifth embodiment of the present disclosure. The array antenna 800 includes a plurality of the Duo Aloe Vera Cruces Concentricis antenna structure 100 of the first embodiment. Specifically, the array antenna 800 is composed of 3*3 array of the Duo Aloe Vera Cruces Concentricis antenna structure 100; in other words, the Duo Aloe Vera Cruces Concentricis antenna structure 100 is a unit cell antenna structure of the array antenna 800. For the structure of the array antenna 800, the first conductive layers 200 of the Duo Aloe Vera Cruces Concentricis antenna structures 100 are arranged at intervals, and the dielectric layers 300 of the Duo Aloe Vera Cruces Concentricis antenna structures 100 are arranged at intervals. The second conductive layers 400 of the Duo Aloe Vera Cruces Concentricis antenna structure 100 are connected to each other or formed integrally. A slot 810 is located between each two of the first conductive layers 200 and has a width 811. A plurality of the slots 810 are connected to each other in a grillage type. The widths 811 of the slots 810 are the same, and the width 811 of each of the slots 810 is 100 nm. In other embodiments, the first conductive layers of the Duo Aloe Vera Cruces Concentricis antenna structures can be electrically connected in series, and the dielectric layers of the Duo Aloe Vera Cruces Concentricis antenna structures can be electrically connected in series, so that it can increase the voltage output; or the first conductive layers of the Duo Aloe Vera Cruces Concentricis antenna structures can be connected in parallel, and the dielectric layers of the Duo Aloe Vera Cruces Concentricis antenna structures can be connected in parallel to increase the output current.

In the following part, the characteristics of the Duo Aloe Vera Cruces Concentricis antenna structures 100 and the array antenna 800 are tested, and the results thereof will be discussed.

<Test for Reflectance, Transmittance and Absorptance>

Figure 7A:
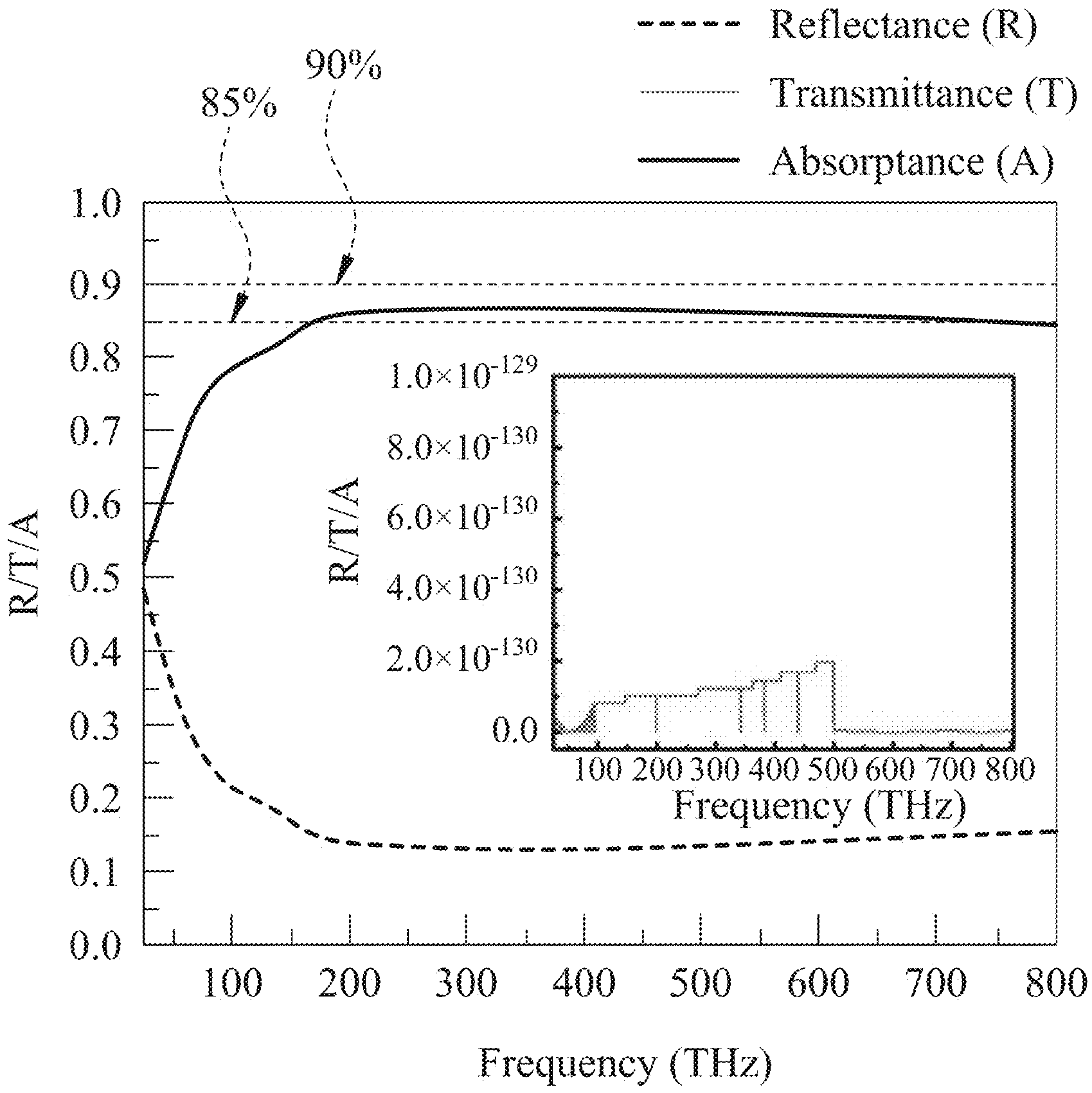
FIG. 7A shows a curve diagram of reflectance, transmittance and absorptance of the Duo Aloe Vera Cruces Concentricis antenna structure under normal incidence of a plane wave.
Figure 7B:
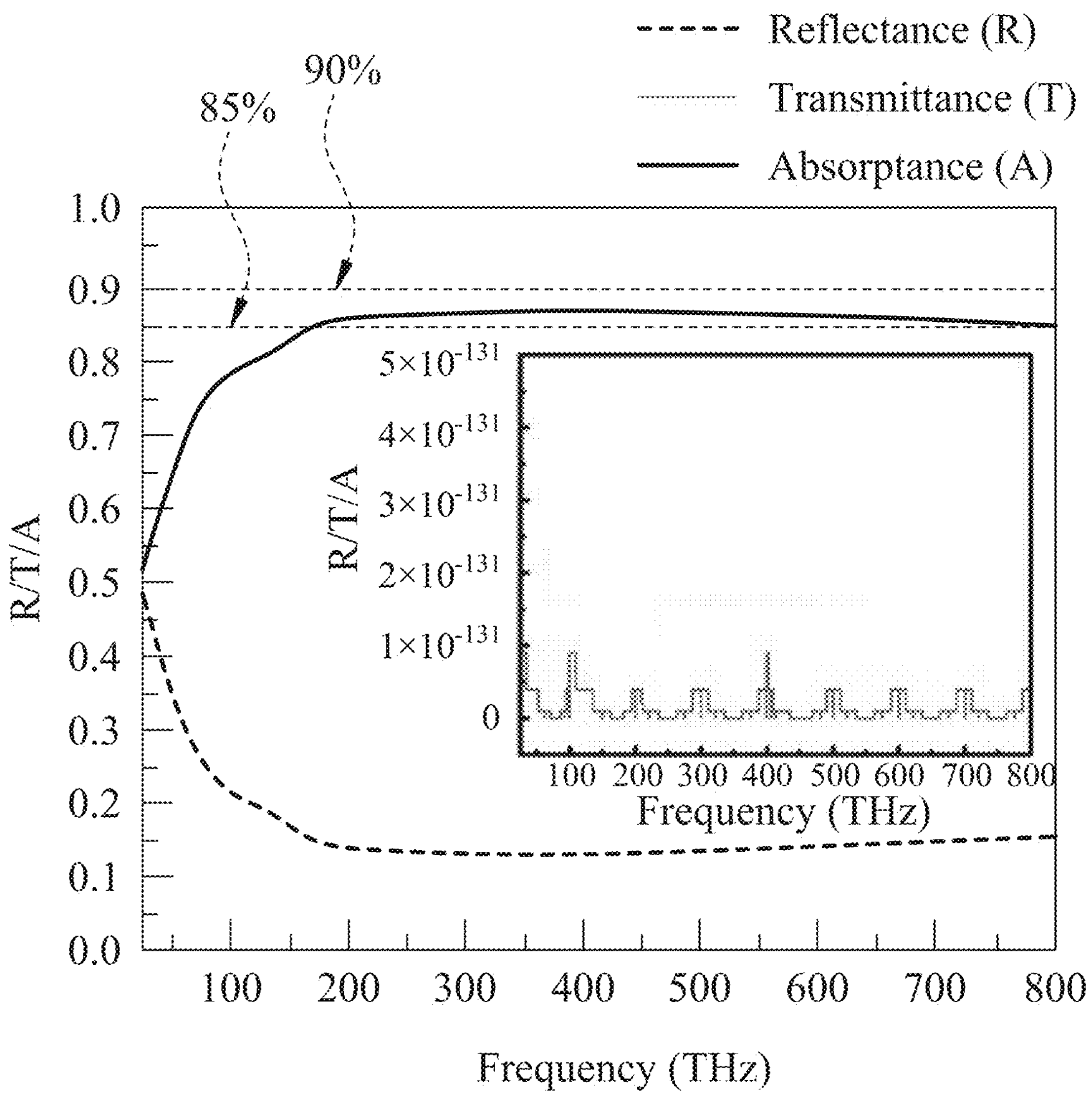
FIG. 7B shows a curve diagram of reflectance, transmittance and absorptance of the array antenna under normal incidence of the plane wave.

In order to shed light on the physical origin of ultra-wideband (UWB) absorption, the Duo Aloe Vera Cruces Concentricis antenna structure 100 and the array antenna 800 are tested under normal incidence to obtain reflectance, transmittance and absorptance. Please refer to FIG. 7A and FIG. 7B. FIG. 7A shows a curve diagram of reflectance, transmittance and absorptance of the Duo Aloe Vera Cruces Concentricis antenna structure 100 under normal incidence of a plane wave. FIG. 7B shows a curve diagram of reflectance, transmittance and absorptance of the array antenna 800 under normal incidence of the plane wave. In FIG. 7A and FIG. 7B, the Duo Aloe Vera Cruces Concentricis antenna structure 100 has an excellent absorption bandwidth of 84.5% absorptance, which reaches as high as 775 THz from 25 THz to 800 THz. The absorption performance of the array antenna 800 is not so differing from the Duo Aloe Vera Cruces Concentricis antenna structure 100, and follows almost the similar trend to that of the Duo Aloe Vera Cruces Concentricis antenna structure 100. The array antenna 800 can obtain an average absorptance of 83.4% within the operating frequency band.

This UWB and high absorption originates from the mutual coupling and overlapping between the consecutive resonances in the Duo Aloe Vera Cruces Concentricis antenna structure 100. The interaction between the incoming waves and the tapered structure of the Duo Aloe Vera Cruces Concentricis antenna structure 100 causes more energy to be consumed by the antenna. In this case, most of the reflected waves are destructively coherent with each other within the operating frequency range, and therefore less amount incident wave is reflected back from the surface, resulting in a wide band absorption.

<Test for Impedance>

Figure 8A:
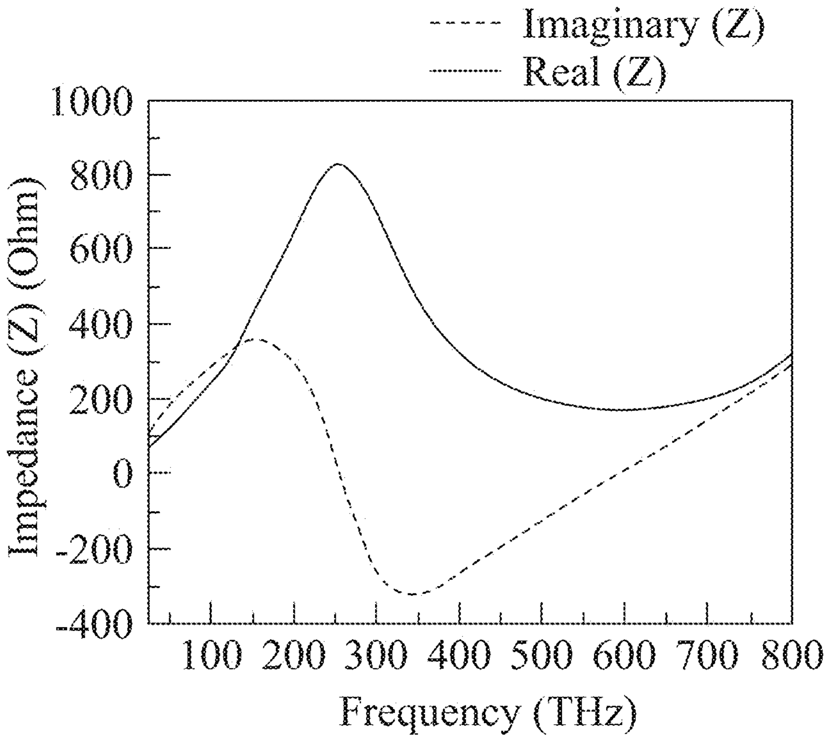
FIG. 8A shows a curve diagram of a real part and an imaginary part of an impedance of the Duo Aloe Vera Cruces Concentricis antenna structure.
Figure 8B:
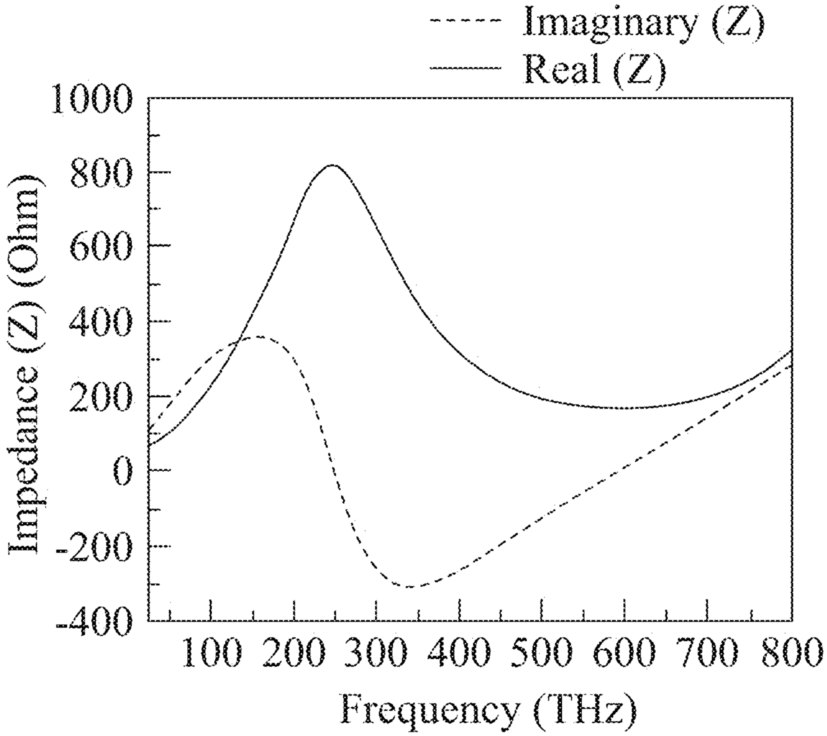
FIG. 8B shows a curve diagram of a real part and an imaginary part of an impedance of the array antenna.

Please refer to FIG. 8A and FIG. 8B. FIG. 8A shows a curve diagram of a real part and an imaginary part of an impedance of the Duo Aloe Vera Cruces Concentricis antenna structure 100. FIG. 8B shows a curve diagram of a real part and an imaginary part of an impedance of the array antenna 800. In FIG. 8A and FIG. 8B, more the relative impedance of an absorber (i.e., the Duo Aloe Vera Cruces Concentricis antenna structure 100 and the array antenna 800) matches the free space, the higher the absorption rate of the absorber. Generally, the broadband and high absorption mechanism at radio frequencies (RF) is quite straightforward. At radio frequencies, the metals behave like perfect conductors with the skin depth becomes negligible compared to the size of the antenna.

The incident wave will be reflected or absorbed as it propagates as a plane wave on the tapered structure of the Duo Aloe Vera Cruces Concentricis antenna structure 100, depending on the mismatch of impedance of the structure to the free space impedance. The strong impedance matching between the array antenna 800 and the surrounding free space is a reason to achieve this broadband characteristic. The second conductive layer 400 of the Duo Aloe Vera Cruces Concentricis antenna structure 100 is sufficiently larger than the skin depth in the operating frequency regime, which causes negligible transmission (nearly zero) and results in high structural absorption.

<Test for Electric Field Distribution>

Figure 9A:
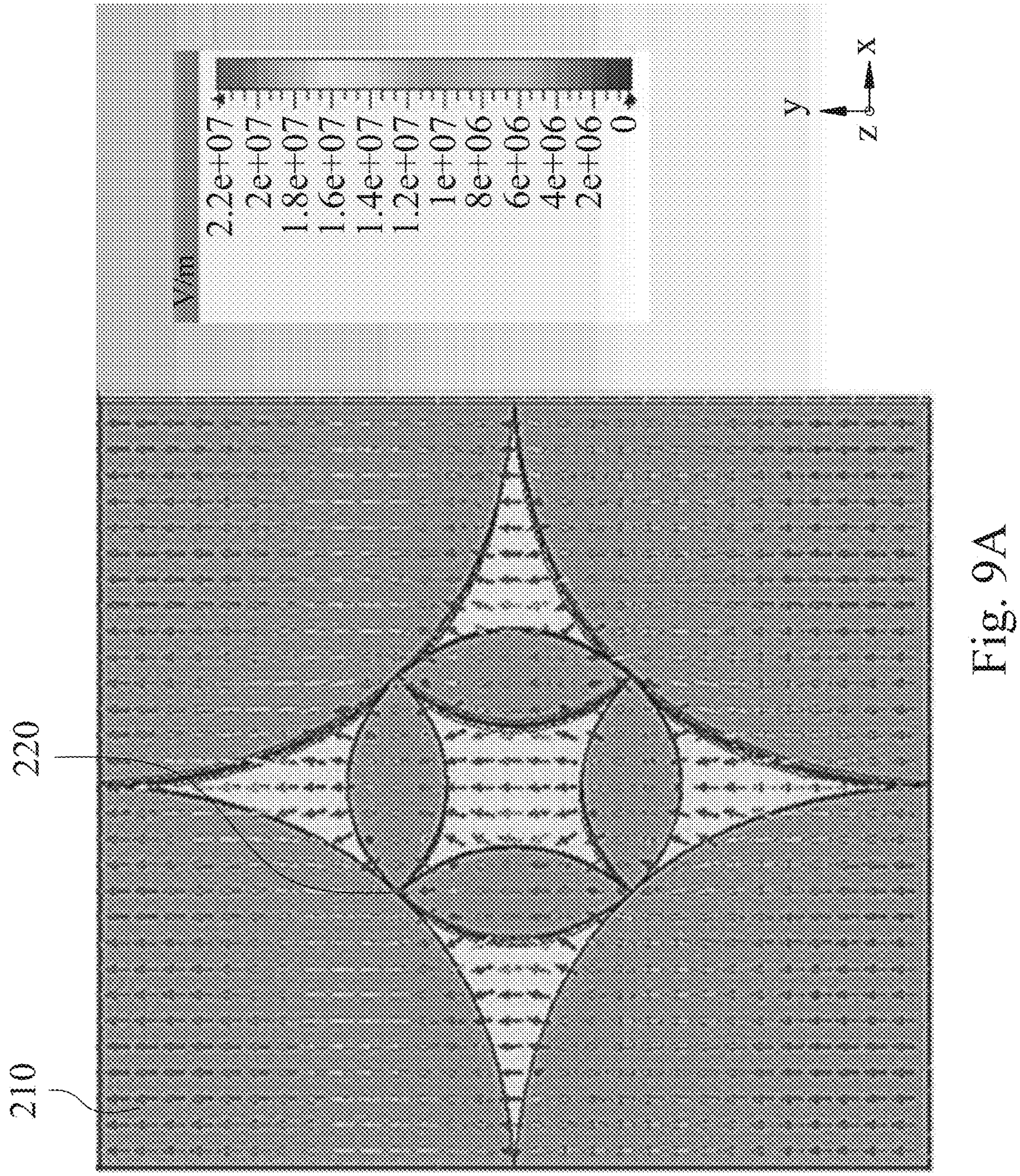
FIG. 9A shows a top view of an electric field distribution of the Duo Aloe Vera Cruces Concentricis antenna structure.
Figure 9B:
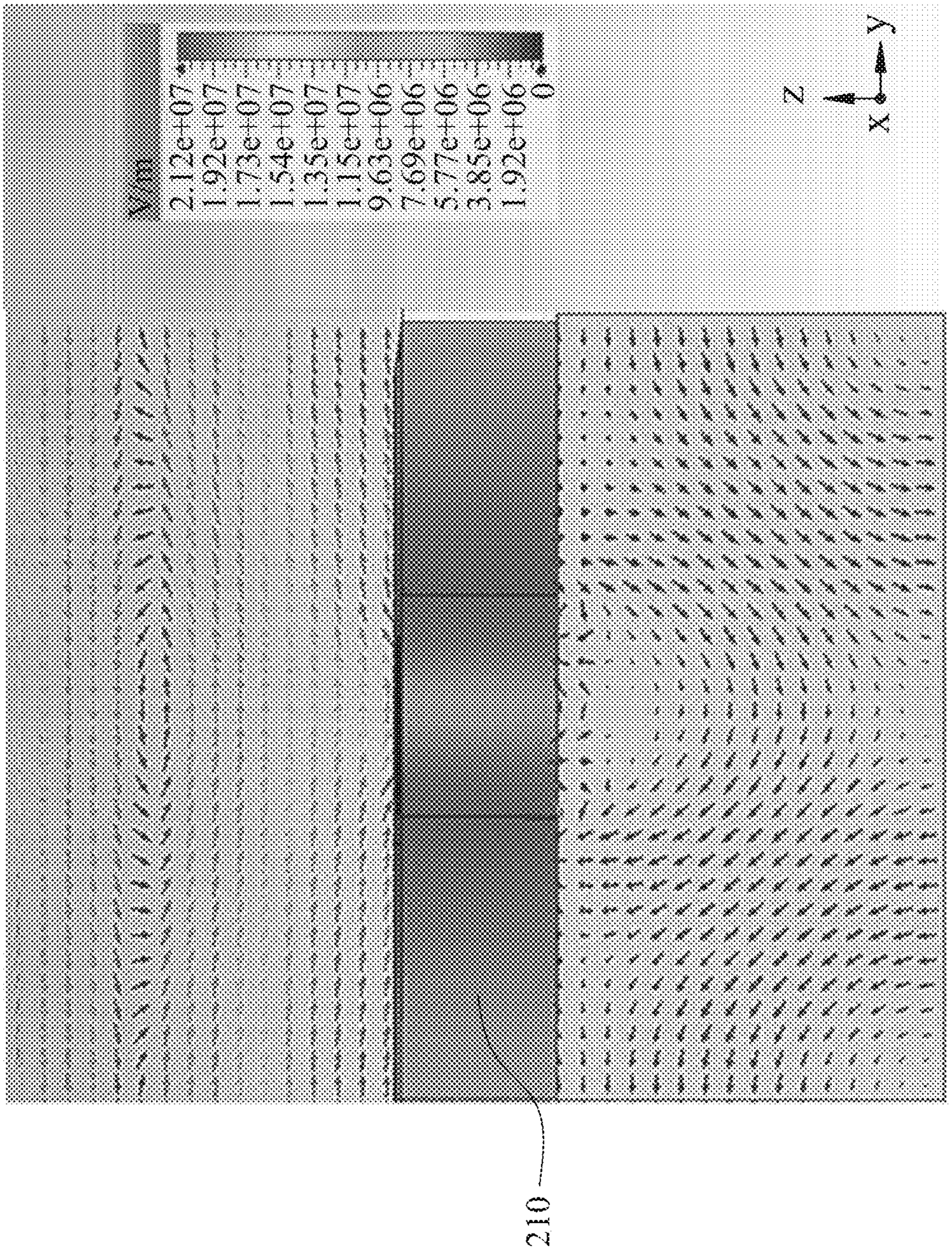
FIG. 9B shows a cross-sectional view of the electric field distribution of the Duo Aloe Vera Cruces Concentricis antenna structure.

In order to figure out the underlying physics behind such ultra-wideband absorption, an electric field distribution of the Duo Aloe Vera Cruces Concentricis antenna structure 100 is investigated. Please refer to FIG. 9A and FIG. 9B. FIG. 9A shows a top view of an electric field distribution of the Duo Aloe Vera Cruces Concentricis antenna structure 100. FIG. 9B shows a cross-sectional view of the electric field distribution of the Duo Aloe Vera Cruces Concentricis antenna structure 100. In FIG. 9A and FIG. 9B, one particular frequency 278.5 THz is selected to observe the top view (at z=0.9 μm) in the x-y plane and the cross-sectional view (at x=0.141 μm) in y-z plane of electric field distributions, respectively. It is observed that most of the electric fields are confined to the surface of both the first metal unit 210 and the second metal units 220. The electric fields are stronger at the surface of both the first metal unit 210 and the second metal unit 220, which means that there is mutual influence between two of the first metal units 210 having adjacent, and between two of the second metal units 220 having adjacent. It is also seen that the electric fields decrease significantly as EM waves propagating inside the Duo Aloe Vera Cruces Concentricis antenna structure 100 and almost vanish when reaching the second conductive layer 400 at the bottom (not shown in FIG. 9B). Therefore, the UWB absorption of the Duo Aloe Vera Cruces Concentricis antenna structure 100 is suggested to the consecutive electromagnetic resonance of the metal phase Ni generated at the multi-frequency point (from 170 THz to 800 THz), resulting in the efficient UWB absorption in the operating frequency regime.

<Test for Power Flow>

Figure 10:
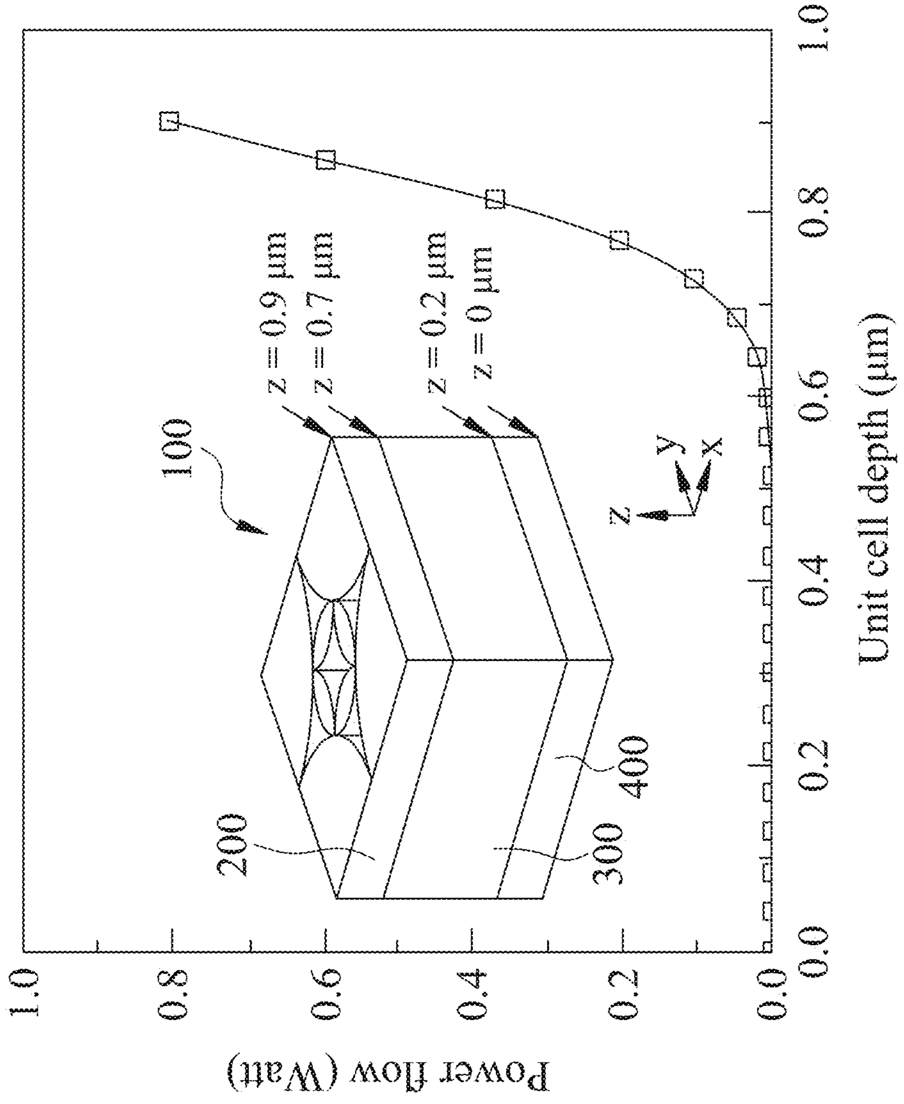
FIG. 10 shows a curve diagram of a power flow across different depths of the Duo Aloe Vera Cruces Concentricis antenna structure at 278.5 THz.

Please refer to FIG. 10. FIG. 10 shows a curve diagram of a power flow across different depths of the Duo Aloe Vera Cruces Concentricis antenna structure 100 at 278.5 THz. In FIG. 10, the excitation power used for the test is 1.0 Watt. It is clear that significant amount of power (0.8 Watt at the surface) is absorbed by the first conductive layer 200, and very less amount of power is absorbed by the dielectric layer 300 and the second conductive layer 400. The absorption of the Duo Aloe Vera Cruces Concentricis antenna structure 100 is mainly attributed to the ohmic loss or resistive loss at the first conductive layer 200. Most of the absorption occurs on the first conductive layer 200, and can be transformed to temperature rise of a top metal film of the first conductive layer 200.

<Tests for Transverse Electric (TE) Mode and Transverse Magnetic (TM) Mode>

Figure 11A:
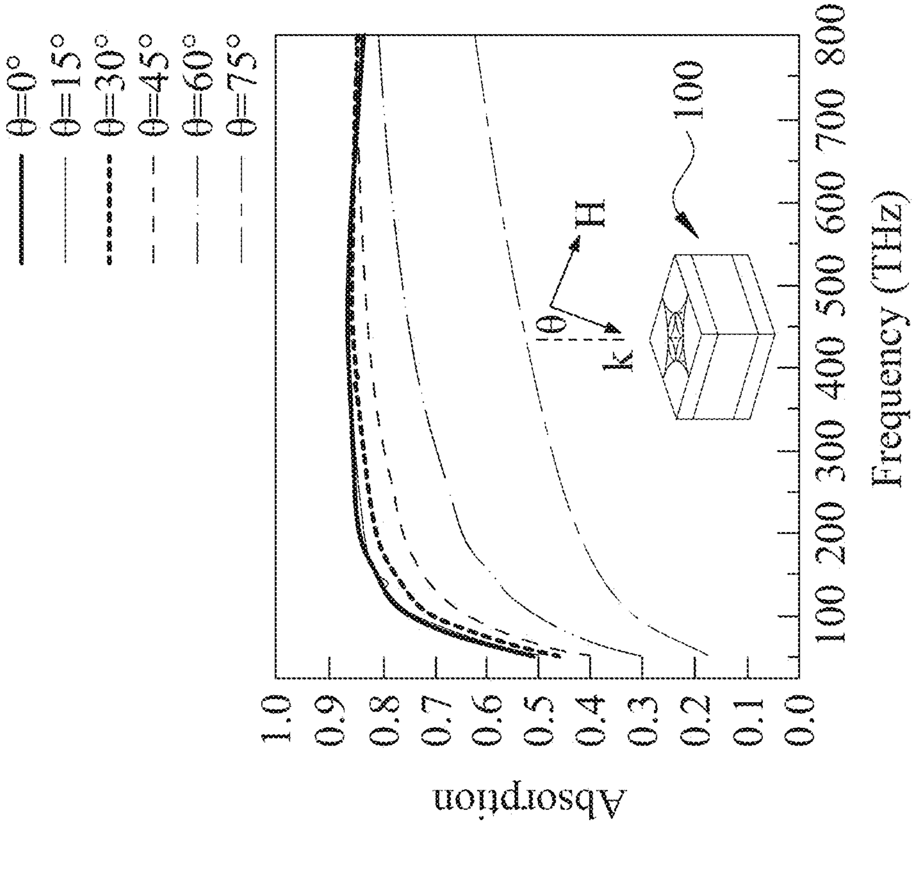
FIG. 11A shows a curve diagram of an absorption spectra of the Duo Aloe Vera Cruces Concentricis antenna structure with different incidence angles ranging from 0° to 75° for Transverse Electric mode.
Figure 11B:
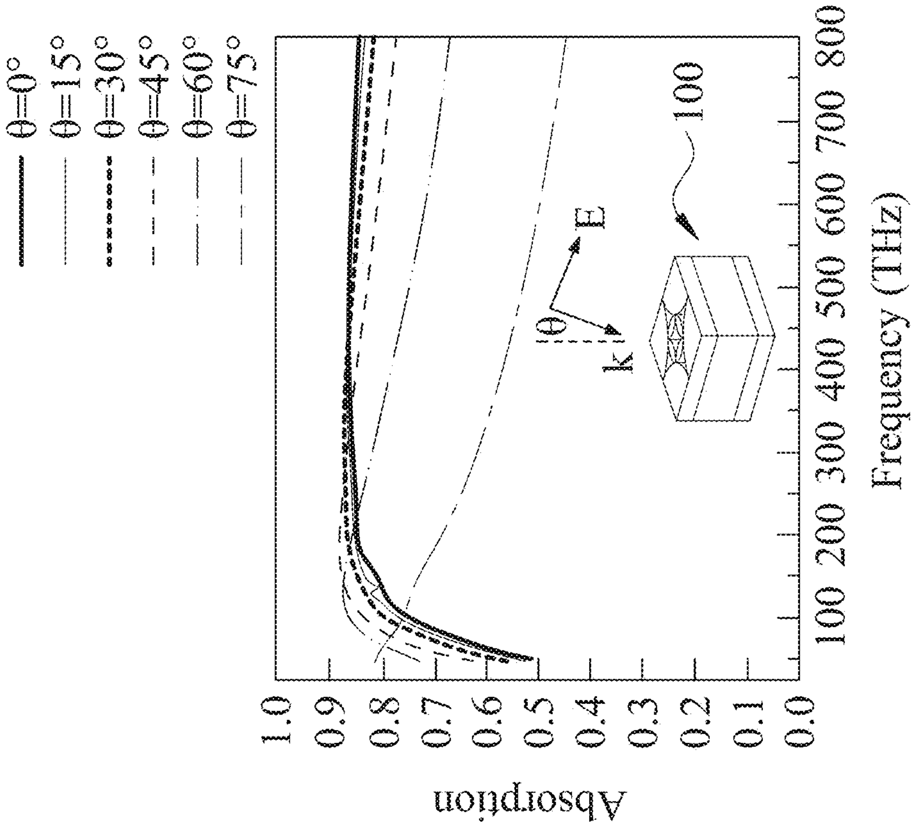
FIG. 11B shows a curve diagram of an absorption spectra of the Duo Aloe Vera Cruces Concentricis antenna structure with different incidence angles ranging from 0° to 75° for Transverse Magnetic mode.
Figure 11D:
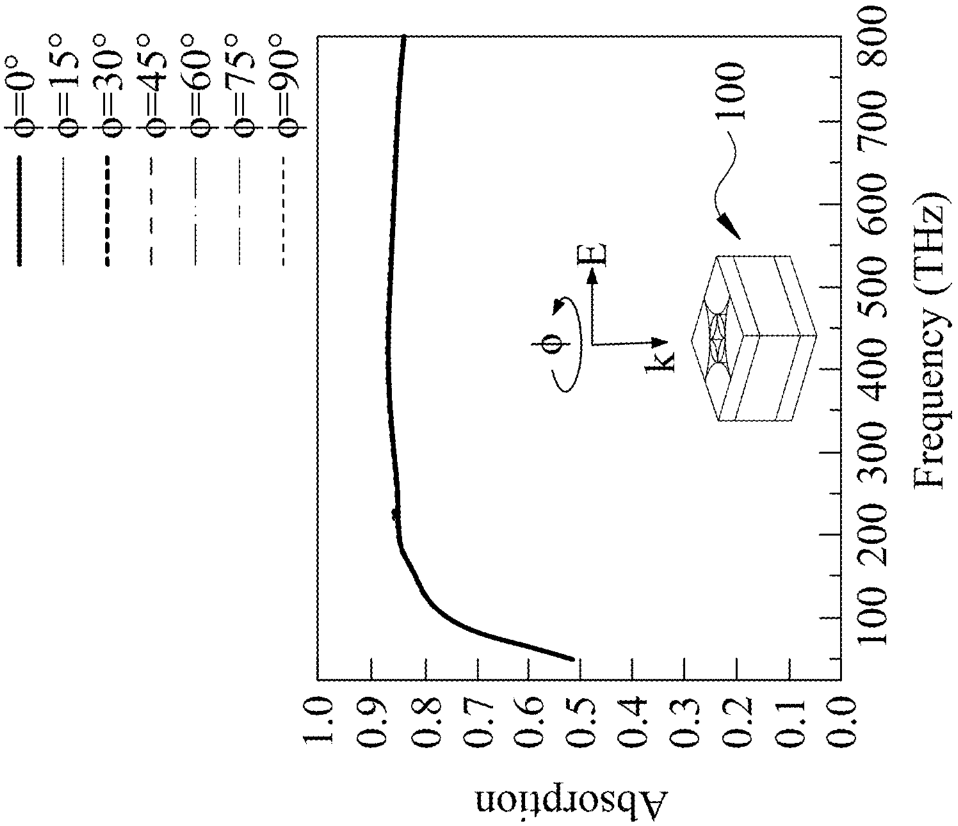
FIG. 11D shows a curve diagram of an absorption spectra of the Duo Aloe Vera Cruces Concentricis antenna structure with different polarization angles ranging from 0° to 90° for Transverse Magnetic mode.
Figure 11C:
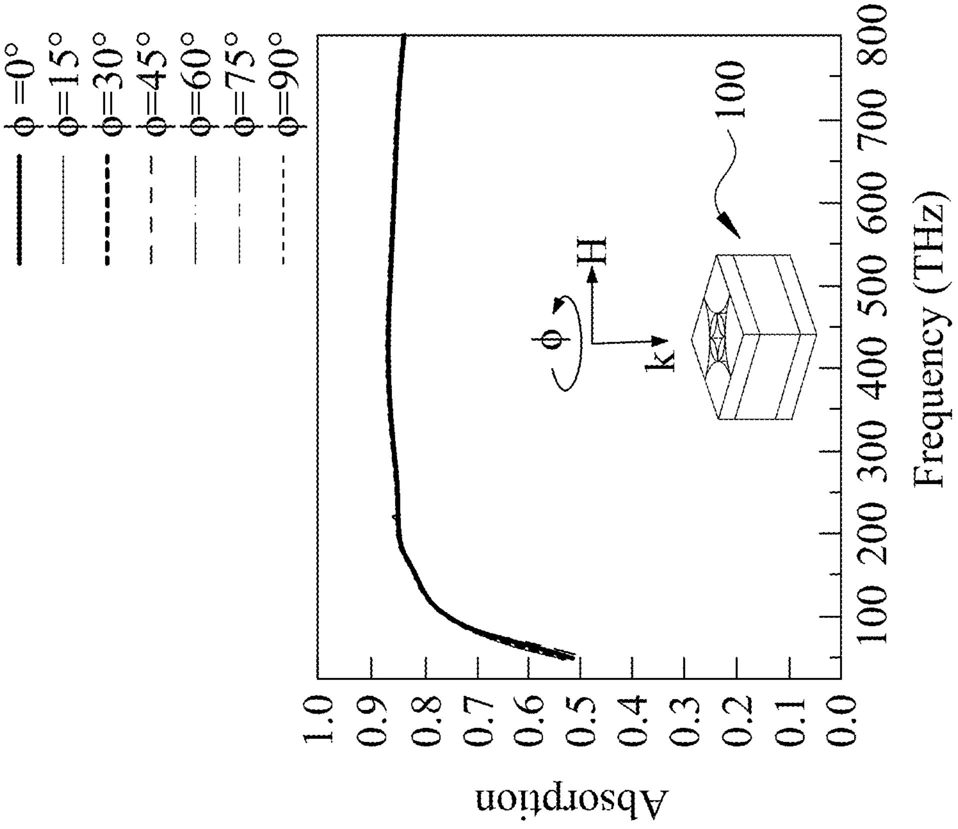
FIG. 11C shows a curve diagram of an absorption spectra of the Duo Aloe Vera Cruces Concentricis antenna structure with different polarization angles ranging from 0° to 90° for Transverse Electric mode.

For the practical applications, the polarization-independent performance and a wide-angle incident wave are vitally important, since in some situations the incident wave is obliquely incident to the device. Therefore, polarization insensitivity of the Duo Aloe Vera Cruces Concentricis antenna structure 100 is tested for normal as well as oblique incidences. Please refer to FIG. 11A, FIG. 11B, FIG. 11C and FIG. 11D. FIG. 11A shows a curve diagram of an absorption spectra of the Duo Aloe Vera Cruces Concentricis antenna structure 100 with different incidence angles θ ranging from 0° to 75° for TE mode. FIG. 11B shows a curve diagram of an absorption spectra of the Duo Aloe Vera Cruces Concentricis antenna structure 100 with different incidence angles θ ranging from 0° to 75° for TM mode. FIG. 11C shows a curve diagram of an absorption spectra of the Duo Aloe Vera Cruces Concentricis antenna structure 100 with different polarization angles ϕ ranging from 0° to 90° for TE mode. FIG. 11D shows a curve diagram of an absorption spectra of the Duo Aloe Vera Cruces Concentricis antenna structure 100 with different polarization angles ¢ ranging from 0° to 90° for TM mode.

In FIG. 11A and FIG. 11B, it is seen that the Duo Aloe Vera Cruces Concentricis antenna structure 100 has no apparent change of absorption performance over the operating frequency ranges, and maintains the average absorption above 82.7% for TE and 83.5% for TM mode under oblique incidence of incoming waves up to 45°. Therefore, the Duo Aloe Vera Cruces Concentricis antenna structure 100 of present disclosure is polarization insensitive up to 45° for both TE and TM modes. The unique mechanism of coupling between relevant electric and magnetic resonances and free-space incident light is attributed with the angle-independent absorption.

In FIG. 11C and FIG. 11D, it is obvious that the average absorption is unchanged and maintained above 83.91% for TE and 83.92% for TM mode up to 90° under normal incidence of plane waves. This outcome attributes that the structure is strongly polarization insensitive up to 90° under normal incidence of incoming waves for both TE and TM modes. From the above findings, it can be concluded that at ϕ=90°, TE becomes TM and vice versa. The polarization insensitive nature of the Duo Aloe Vera Cruces Concentricis antenna structure 100 is mainly due to the symmetrical arrangements of the tapered structure among the first metal units 210 and the second metal units 220. Based on the above numerical results, it is obvious that the Duo Aloe Vera Cruces Concentricis antenna structure 100 of present disclosure is polarization independent under both normal and oblique incidence of plane waves and maintained the absorption performance for both the TE and TM modes within the operation frequency band.

<Tests for Farfield Directivity and Gain>

Figure 12A:
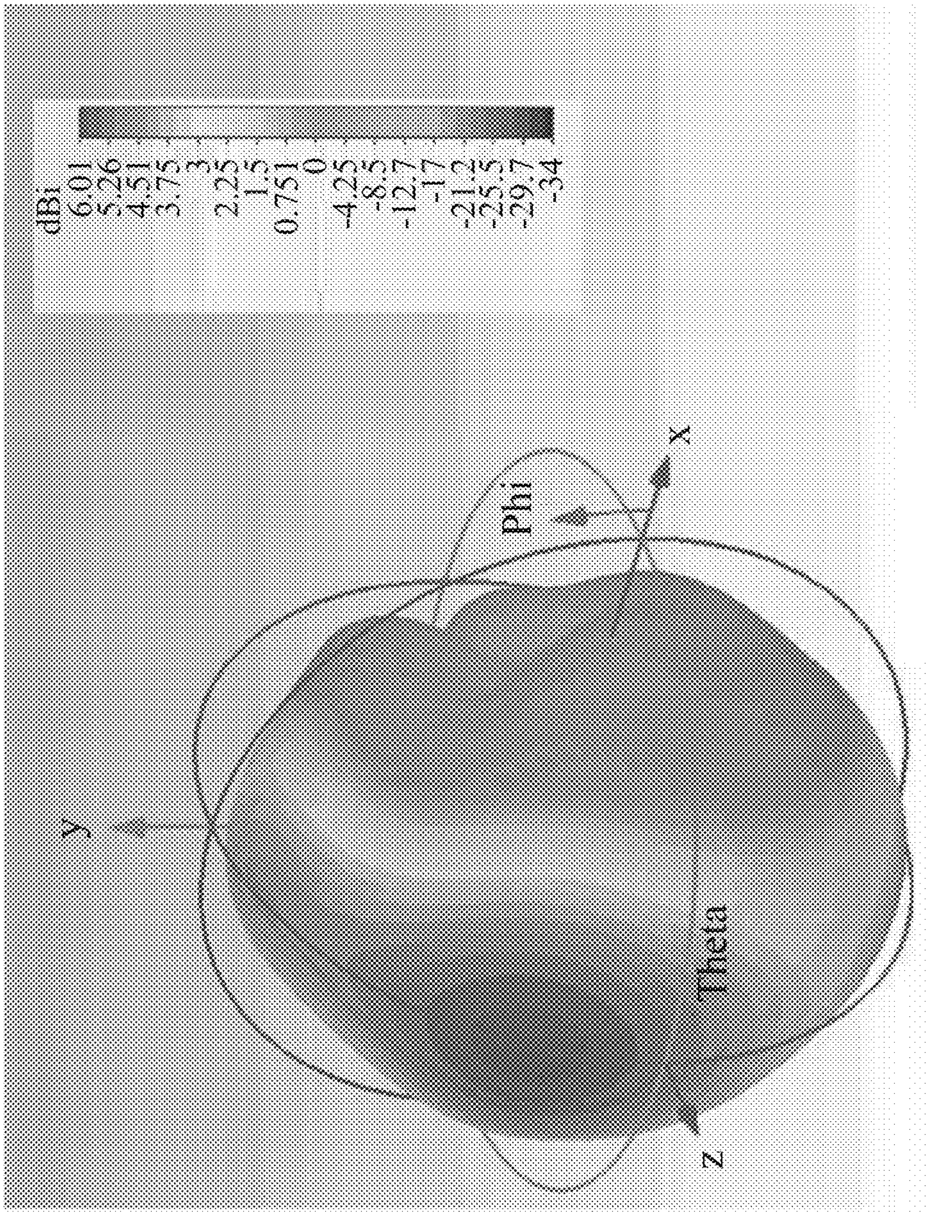
FIG. 12A shows a three-dimensional schematic view of a farfield directivity of the Duo Aloe Vera Cruces Concentricis antenna structure at 278.5 THz.
Figure 12B:
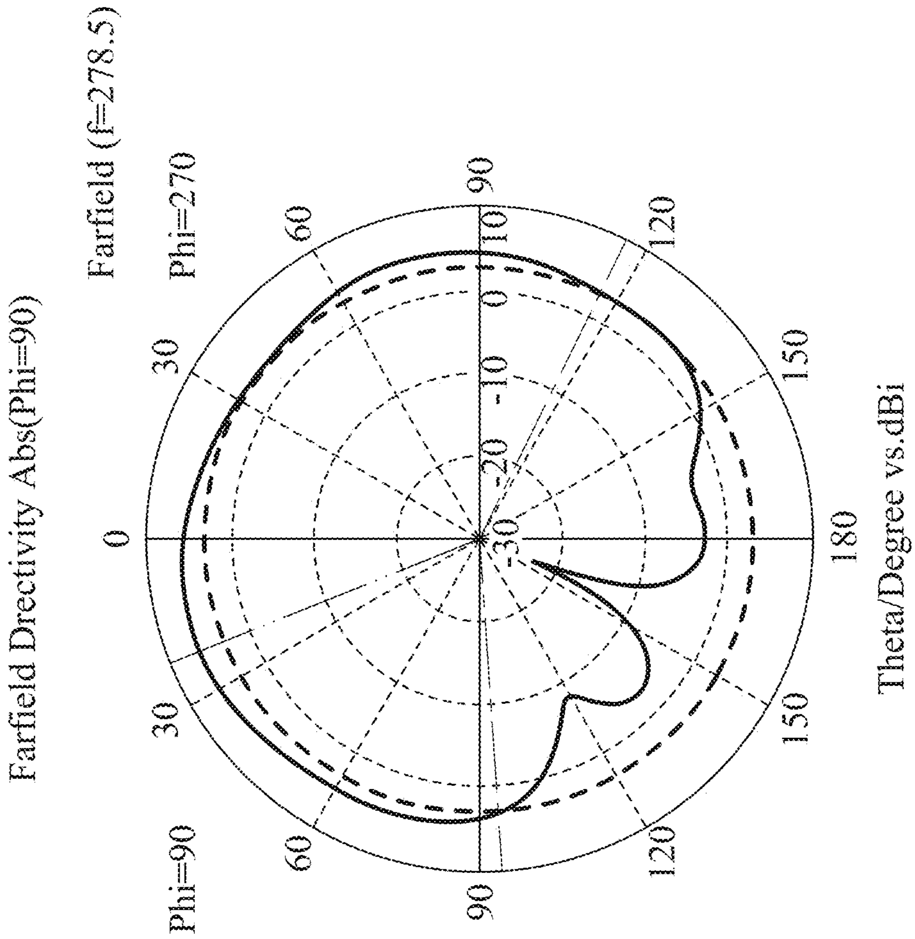
FIG. 12B shows a polar plot of a farfield directivity of the Duo Aloe Vera Cruces Concentricis antenna structure at 278.5 THz.
Figure 13A:
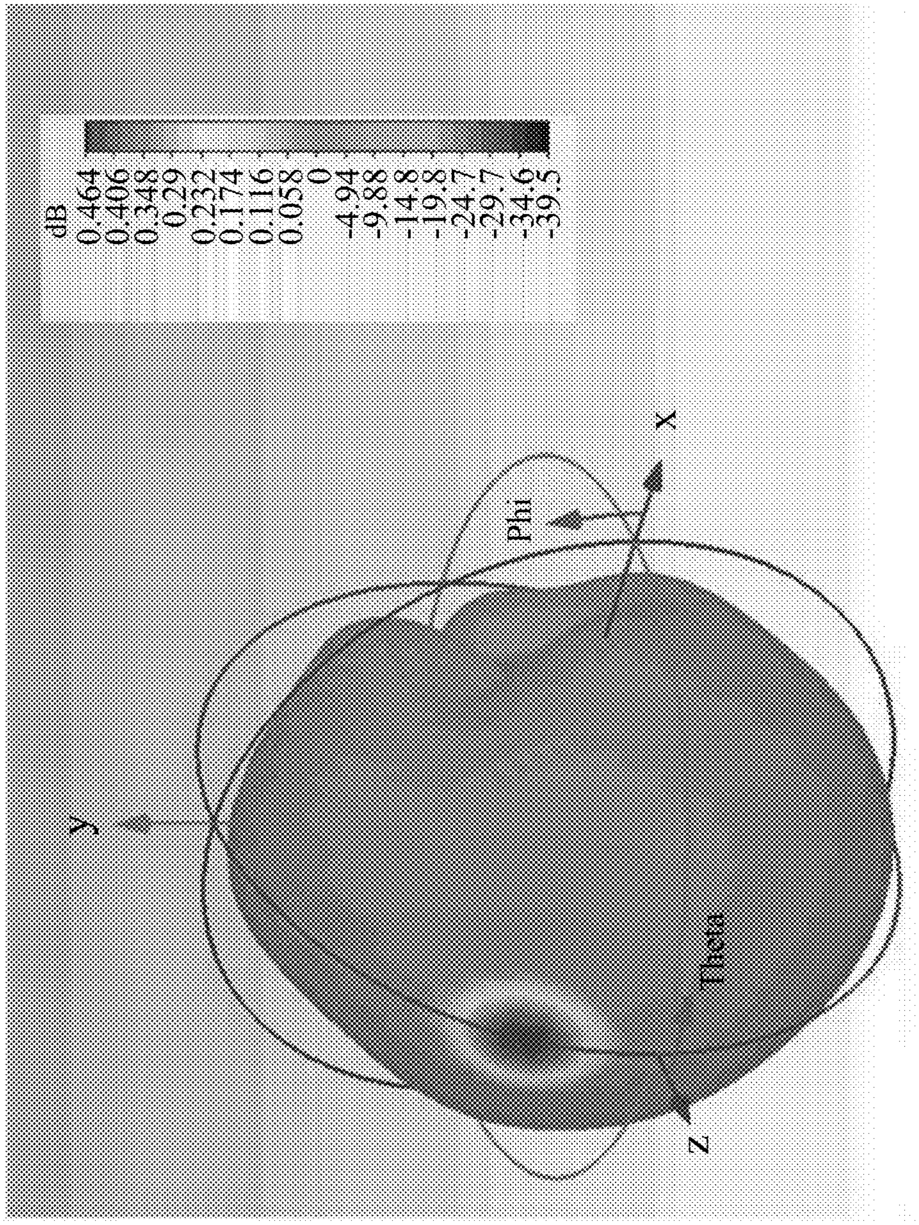
FIG. 13A shows a three-dimensional schematic view of a gain of the Duo Aloe Vera Cruces Concentricis antenna structure at 278.5 THz.
Figure 13B:
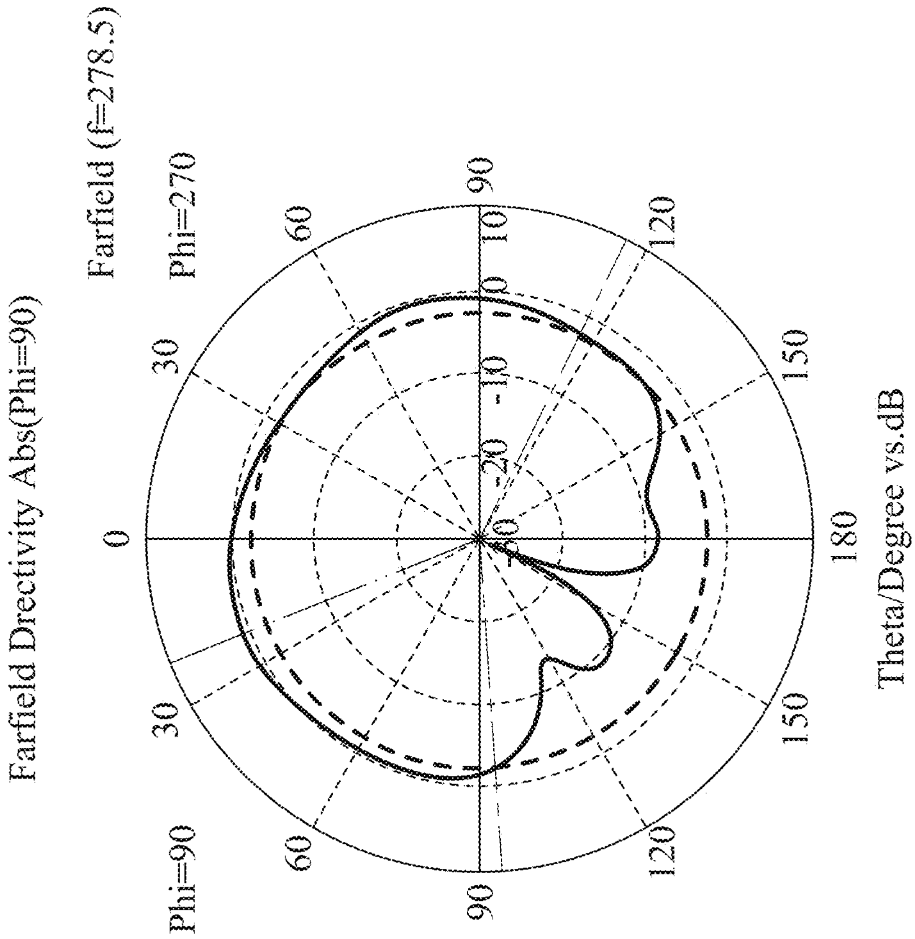
FIG. 13B shows a polar plot of a gain of the Duo Aloe Vera Cruces Concentricis antenna structure at 278.5 THz.

Please refer to FIG. 12A, FIG. 12B, FIG. 13A and FIG. 13B. FIG. 12A shows a three-dimensional schematic view of a farfield directivity of the Duo Aloe Vera Cruces Concentricis antenna structure 100 at 278.5 THz. FIG. 12B shows a polar plot of a farfield directivity of the Duo Aloe Vera Cruces Concentricis antenna structure 100 at 278.5 THz. FIG. 13A shows a three-dimensional schematic view of a gain of the Duo Aloe Vera Cruces Concentricis antenna structure 100 at 278.5 THz. FIG. 13B shows a polar plot of a gain of the Duo Aloe Vera Cruces Concentricis antenna structure 100 at 278.5 THz. In FIG. 12A and FIG. 12B, the obtained numerical result highlights that the radiation patterns exhibit a maximum directivity value of 6.01 dBi. The half-power beam width (HPBW) or 3 dB bandwidth of the Duo Aloe Vera Cruces Concentricis antenna structure 100 at 278.5 THz is 209.8°, which is large enough to affirm the Duo Aloe Vera Cruces Concentricis antenna structure 100 is omnidirectional. The high directivity and beam width of the Duo Aloe Vera Cruces Concentricis antenna structure 100 at 278.5 THz is due to symmetric flower petals geometry. In addition, there are no nulls and lobes present on the pattern results in omnidirectional radiation pattern. Therefore, the absence of lobes and nulls on the pattern of the first conductive layer 200 maximize the directivity results in the better performance of the Duo Aloe Vera Cruces Concentricis antenna structure 100.

The gain of the Duo Aloe Vera Cruces Concentricis antenna structure 100, which is a measure of the maximum effectiveness with which the Duo Aloe Vera Cruces Concentricis antenna structure 100 can radiate or absorb the power delivered to/received by it from the external power or radiation source. More specifically, it is defined as the maximum radiation intensity produced/absorbed by the Duo Aloe Vera Cruces Concentricis antenna structure 100 compared to that given by a lossless isotropic antenna supplied with or received by the same amount of power. In FIG. 13A and FIG. 13B, the Duo Aloe Vera Cruces Concentricis antenna structure 100 of present disclosure provides the optimal gain of 0.464 dB and broader 3 dB bandwidth of 209.8°. The gain of 0.464 dB means that 1.112 times the amount of effective power can be received by the Duo Aloe Vera Cruces Concentricis antenna structure 100 than from an isotropic antenna.

Figure 14:
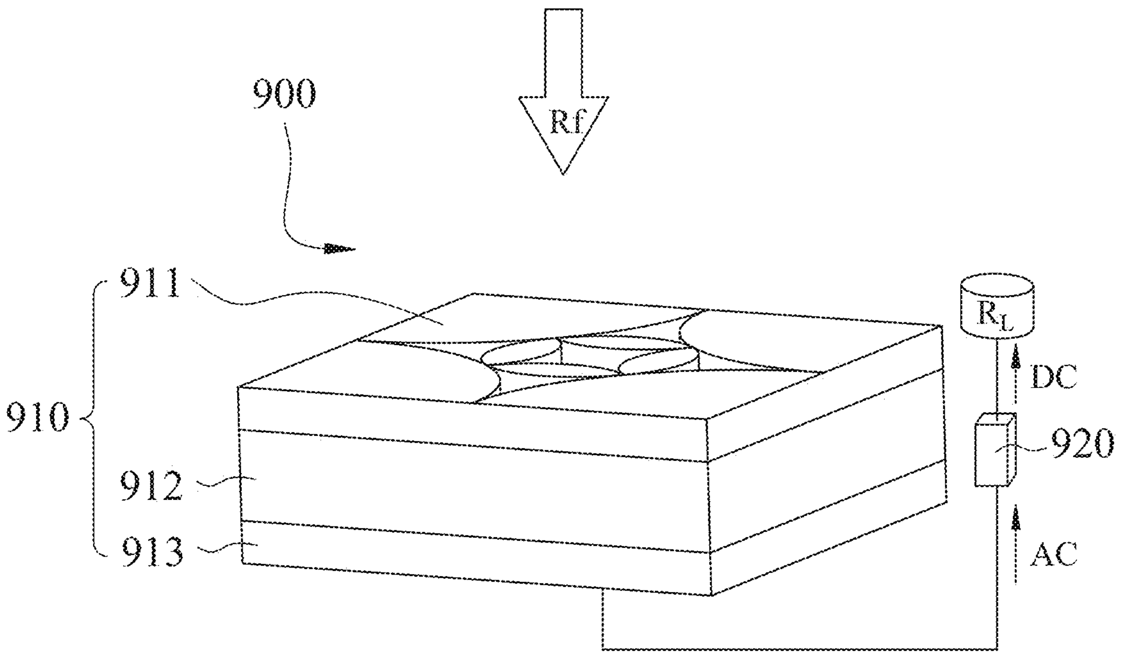
FIG. 14 shows a schematic view of a rectenna according to the sixth embodiment of the present disclosure.

Please refer to FIG. 14. FIG. 14 shows a schematic view of a rectenna 900 according to the sixth embodiment of the present disclosure. The rectenna 900 can be used for a communication or an energy harvesting device, and includes a Duo Aloe Vera Cruces Concentricis antenna structure 910 and a rectifier module 920. The Duo Aloe Vera Cruces Concentricis antenna structure 910 can include a first conductive layer 911, a dielectric layer 912 and a second conductive layer 913. The structural configuration among the first conductive layer 911, the dielectric layer 912 and the second conductive layer 913 have the same structural configuration as the elements corresponding to the Duo Aloe Vera Cruces Concentricis antenna structure 100 of the first embodiment, and are not be described again herein.

The first conductive layer 911 of the Duo Aloe Vera Cruces Concentricis antenna structure 910 receives a radio frequency signal Rf or a radiation (not shown). The rectifier module 920 is electrically connected to the second conductive layer 913 of the Duo Aloe Vera Cruces Concentricis antenna structure 910 and converts the radio frequency signal Rf or the radiation from an alternating current AC into a direct current DC. The direct current DC is delivered to a load $R_L$ and provides a power source for the load $R_L$. Specifically, in response to determining that the rectenna 900 receives RF signals, the rectenna 900 can be used for the communication. In response to determining that the rectenna 900 receives the radiation, the rectenna 900 can be used for energy harvesting. It is worth noting that, the rectenna 900 of the sixth embodiment is a completely different energy harvesting device from the thermoelectric energy harvester 600 of FIG. 4. In FIG. 14, the radio frequency signal Rf can be converted from the alternating current AC into the direct current DC by connecting the Duo Aloe Vera Cruces Concentricis antenna structure 910 to the rectifier module 920. In FIG. 4, a radio frequency radiation (not shown) can be absorbed by the thermoelectric energy harvester 600 and converted into the direct current DC using rectification.

In summary, the present disclosure has the following advantages. First, the Duo Aloe Vera Cruces Concentricis antenna structure has an excellent absorption bandwidth of 84.5% absorbance reaches as high as 775 THz from 25 to 800 THz under the normal incidence. Second, the Duo Aloe Vera Cruces Concentricis antenna structure generates less than 5% absorption deviation between normal to 45° incident angle and 0.05% absorption deviation between 0° and 90° polarization for both TE and TM modes. Third, the Duo Aloe Vera Cruces Concentricis antenna structure is omnidirectional due to its HPBW or 3 dB bandwidth of 209.8° at 278.5 THz.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A Duo Aloe Vera Cruces Concentricis antenna structure, comprising:

a first conductive layer, comprising:

a plurality of first metal units arranged around each other to form a first tapered hole; and a plurality of second metal units located in the first tapered hole and arranged around each other to form a second tapered hole;

a dielectric layer connected to the first conductive layer, and comprising:

a plurality of third units aligned with the first metal units, respectively; and a plurality of fourth units aligned with the second metal units, respectively; and a second conductive layer connected to the dielectric layer, wherein the dielectric layer is located between the first conductive layer and the second conductive layer;

wherein the first tapered hole has at least one first center line passed through a center of the first tapered hole, the second tapered hole has at least one second center line passed through a center of the second tapered hole, and an included angle between the at least one first center line and the at least one second center line is 45 degrees.

2. The Duo Aloe Vera Cruces Concentricis antenna structure of claim 1, wherein a number of the at least one first center line is two, a number of the at least one second center line is two, the first center lines are perpendicular to each other, and the second center lines are perpendicular to each other.

3. The Duo Aloe Vera Cruces Concentricis antenna structure of claim 2, wherein each of the first metal units comprises a curved surface, the curved surfaces of each two of the first metal units adjacent to each other are connected to each other, the curved surfaces of the first metal units form a plurality of peaks, two of the peaks are located on one of the first center lines, and another two of the peaks are located on the other of the first center lines.

4. The Duo Aloe Vera Cruces Concentricis antenna structure of claim 3, wherein a profile of the curved surface is an exponential taper, and the exponential taper is defined by an opening rate and two points in a x-y plane and satisfies a plurality of following equations:

$$y = c_1 e^{Rx} + c_2;$$

$$c_1 = \frac{y_2 - y_1}{e^{Rx_2} - e^{Rx_1}};$$

$$c_2 = \frac{y_1 e^{Rx_2} - y_2 e^{Rx_1}}{e^{Rx_2} - e^{Rx_1}};$$

wherein the opening rate is represented as R and varies from 0 to 0.7, a x-coordinate of the x-y plane is represented as x, a y-coordinate of the x-y plane is represented as y, a x-coordinate of one of the two points is represented as $x_1$, a y-coordinate of the one of the two points is represented as $y_1$, a x-coordinate of the other of the two points is represented as $x_2$, a y-coordinate of the other of the two points is represented as $y_2$, a first variable value is represented as $C_1$, and a second variable value is represented as $C_2$.

5. The Duo Aloe Vera Cruces Concentricis antenna structure of claim 4, wherein in response to determining that a taper slope of the exponential taper at R≅0 is represented as S, a first taper slope of the exponential taper at $x=x_1$ is represented as $S_1$, a second taper slope of the exponential taper at $x=x_2$ is represented as $S_2$, a taper flare angle of the exponential taper is represented as α, and a plurality of following equations are satisfied:

$$S = \frac{y_2 - y_2}{x_2 - x_2};$$

$$S_1 < S < S_2;$$

$$\alpha = \tan^{-1} S.$$

6. The Duo Aloe Vera Cruces Concentricis antenna structure of claim 2, wherein each of the second metal units comprises an outer curved surface and an inner curved surface, the outer curved surface and the inner curved surface form a leaf pattern, the inner curved surfaces of each two of the second metal units adjacent to each other are connected to each other, the inner curved surfaces of the second metal units form a plurality of peaks, two of the peaks are located on one of the second center lines, and another two of the peaks are located on the other of the second center lines.

7. The Duo Aloe Vera Cruces Concentricis antenna structure of claim 2, wherein the third units are arranged around each other to form a third tapered hole, the fourth units are located in the third tapered hole and arranged around each other to form a fourth tapered hole, the third tapered hole has at least one third center line passed through a center of the third tapered hole, the fourth tapered hole has at least one fourth center line passed through a center of the fourth tapered hole, and an included angle between the at least one third center line and the at least one fourth center line is 45 degrees.

8. The Duo Aloe Vera Cruces Concentricis antenna structure of claim 1, wherein the second conductive layer comprises a surface, one of the first metal units and one of the third units are laminated and cover the surface, and one of the second metal units and one of the fourth metal units are laminated and cover the surface.

9. The Duo Aloe Vera Cruces Concentricis antenna structure of claim 1, wherein the dielectric layer consists of a passive dielectric material.

10. The Duo Aloe Vera Cruces Concentricis antenna structure of claim 1, wherein a thickness of the first conductive layer is $Z_1$, a thickness of the dielectric layer is $Z_2$, a thickness of the second conductive layer is $Z_3$, and the following condition is satisfied:

$$Z_1=Z_3\leq Z_2.$$

11. The Duo Aloe Vera Cruces Concentricis antenna structure of claim 10, wherein the thickness of the first conductive layer is greater than a skin depth of the first conductive layer, the thickness of the dielectric layer is greater than a penetration depth of the dielectric layer, and the thickness of the second conductive layer is greater than a skin depth of the second conductive layer.

12. An electromagnetic wave energy absorber, comprising:

a nanoantenna comprising at least one Duo Aloe Vera Cruces Concentricis antenna structure of claim 1, wherein the nanoantenna is configured to absorb an incident radiation, and a frequency of the incident radiation is f, and the following condition is satisfied:

$$25\ \text{THz}<f\leq 800\ \text{THz}.$$

13. The electromagnetic wave energy absorber of claim 12, wherein the incident radiation is incident on the nanoantenna in a normal direction, and the nanoantenna has an average absorption corresponding to the incident radiation, the average absorption is AA, and the following condition is satisfied:

$$84.5\%\leq AA.$$

14. A photoconductive antenna, which is configured to replace one of a spiral antenna and a bow tie antenna, and the photoconductive antenna comprising:

the first conductive layer of the Duo Aloe Vera Cruces Concentricis antenna structure of claim 1;

a photo-absorbing semiconductor layer connected to the first conductive layer, wherein a structure of the photo-absorbing semiconductor layer is same as a structure of the dielectric layer of the Duo Aloe Vera Cruces Concentricis antenna structure of claim 1; and the second conductive layer of the Duo Aloe Vera Cruces Concentricis antenna structure of claim 1 connected to the photo-absorbing semiconductor layer, wherein the photo-absorbing semiconductor layer is located between the first conductive layer and the second conductive layer.

15. An array antenna, comprising:

a plurality of the Duo Aloe Vera Cruces Concentricis antenna structure of claim 1, wherein a plurality of the first conductive layers of the Duo Aloe Vera Cruces Concentricis antenna structures are arranged at intervals, a plurality of the dielectric layers of the Duo Aloe Vera Cruces Concentricis antenna structures are arranged at intervals, and a plurality of the second conductive layers of the Duo Aloe Vera Cruces Concentricis antenna structure are connected to each other or formed integrally.

16. The array antenna of claim 15, wherein a slot is located between each two of the first conductive layers and has a width, a plurality of the slots are connected to each other in a grillage type, and the width of each of the slots is the same.

17. A rectenna, which is used for a communication or an energy harvesting device, and the rectenna comprising:

the Duo Aloe Vera Cruces Concentricis antenna structure of claim 1 receiving a radio frequency signal or a radiation; and a rectifier module electrically connected to the Duo Aloe Vera Cruces Concentricis antenna structure and converting the radio frequency signal or the radiation from an alternating current into a direct current.

18. A thermoelectric energy harvester, comprising:

a first conductive layer receiving a heat radiation, and comprising:

a plurality of first metal units arranged around each other to form a first tapered hole; and a plurality of second metal units located in the first tapered hole and arranged around each other to form a second tapered hole;

a dielectric layer connected to the first conductive layer;

a second conductive layer connected to the dielectric layer, wherein the dielectric layer is located between the first conductive layer and the second conductive layer;

a contact electrode disposed through the dielectric layer and electrically connected between the first conductive layer and the second conductive layer; and a coaxial cable electrically connected to the contact electrode and converting the heat radiation into a direct current according to a Seebeck effect;

wherein the first tapered hole has at least one first center line passed through a center of the first tapered hole, the second tapered hole has at least one second center line passed through a center of the second tapered hole, and an included angle between the at least one first center line and the at least one second center line is 45 degrees.

19. The thermoelectric energy harvester of claim 18, wherein a number of the at least one first center line is two, a number of the at least one second center line is two, the first center lines are perpendicular to each other, and the second center lines are perpendicular to each other.

20. The thermoelectric energy harvester of claim 19, wherein each of the first metal units comprises a curved surface, the curved surfaces of each two of the first metal units adjacent to each other are connected to each other, the curved surfaces of the first metal units form a plurality of peaks, two of the peaks are located on one of the first center lines, and another two of the peaks are located on the other of the first center lines.

21. The thermoelectric energy harvester of claim 19, wherein each of the second metal units comprises an outer curved surface and an inner curved surface, the outer curved surface and the inner curved surface form a leaf pattern, the inner curved surfaces of each two of the second metal units adjacent to each other are connected to each other, the inner curved surfaces of the second metal units form a plurality of peaks, two of the peaks are located on one of the second center lines, and another two of the peaks are located on the other of the second center lines.

22. The thermoelectric energy harvester of claim 18, wherein the first conductive layer consists of a P-type semiconductor, and the second conductive layer consists of an N-type semiconductor.

23. The thermoelectric energy harvester of claim 18, wherein the first conductive layer consists of nickel or one of a plurality of P-type conductive materials, and the second conductive layer consists of gold or one of a plurality of N-type conductive materials.

* * * * *